US009880590B2

(12) United States Patent
McClure et al.

(10) Patent No.: US 9,880,590 B2
(45) Date of Patent: Jan. 30, 2018

(54) COMPONENT ASSEMBLY

(71) Applicant: Apple Inc., Cupertino, CA (US)

(72) Inventors: Stephen R. McClure, Belmont, CA (US); Joshua D. Banko, Palo Alto, CA (US); Kevin D. Gibbs, Menlo Park, CA (US); Benjamin M. Rappoport, Santa Barbara, CA (US); John P. Ternus, Los Altos Hills, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/249,287

(22) Filed: Aug. 26, 2016

(65) Prior Publication Data

US 2016/0363961 A1    Dec. 15, 2016

Related U.S. Application Data

(63) Continuation of application No. 13/855,630, filed on Apr. 2, 2013, now Pat. No. 9,431,190, which is a
(Continued)

(51) Int. Cl.
*G06F 1/16* (2006.01)
*H05K 1/02* (2006.01)
(Continued)

(52) U.S. Cl.
CPC .......... *G06F 1/1658* (2013.01); *G06F 1/1613* (2013.01); *G06F 1/1626* (2013.01);
(Continued)

(58) Field of Classification Search
CPC ..................................................... G06F 1/1626
See application file for complete search history.

(56) References Cited

U.S. PATENT DOCUMENTS

| 4,031,348 A | 6/1977 | Eberhardt |
| 4,386,254 A | 5/1983 | Eberhardt et al. |

(Continued)

FOREIGN PATENT DOCUMENTS

| CN | 1388705 A | 1/2003 |
| CN | 1448834 A | 10/2003 |

(Continued)

OTHER PUBLICATIONS

Partial Search Report dated Dec. 14, 2010 in PCT Application No. PCT/US2010/046928.
(Continued)

*Primary Examiner* — Anthony Q Edwards
(74) *Attorney, Agent, or Firm* — Downey Brand LLP

(57) ABSTRACT

A portable computing device is disclosed. The portable computing device can take many forms such as a laptop computer, a tablet computer, and so on. The portable computing device can include at least a single piece housing. The single piece housing including a plurality of steps. The plurality of mounting steps are formed by at least removing a preselected amount of housing material at predetermined locations on the interior surface. At least some of the mounting steps are used to mount at least some of the plurality of internal operating components housing.

20 Claims, 20 Drawing Sheets

Related U.S. Application Data continuation of application No. 12/694,200, filed on Jan. 26, 2010, now Pat. No. 8,432,678.

(60) Provisional application No. 61/292,739, filed on Jan. 6, 2010.

(51) Int. Cl.
*H05K 1/11* (2006.01)
*H01H 13/10* (2006.01)
*H04M 1/02* (2006.01)
*H05K 1/14* (2006.01)

(52) U.S. Cl.
CPC .......... *G06F 1/1635* (2013.01); *G06F 1/1637* (2013.01); *G06F 1/1643* (2013.01); *G06F 1/1656* (2013.01); *H01H 13/10* (2013.01); *H04M 1/0266* (2013.01); *H04M 1/0277* (2013.01); *H05K 1/0281* (2013.01); *H05K 1/118* (2013.01); *H04M 1/0252* (2013.01); *H05K 1/147* (2013.01); *Y10T 29/49002* (2015.01)

(56) References Cited

U.S. PATENT DOCUMENTS

| | | | |
|---|---|---|---|
| 4,467,160 A | 8/1984 | Murmann et al. | |
| 4,468,134 A | 8/1984 | Halicho | |
| 4,845,325 A | 7/1989 | Burchett et al. | |
| 5,248,960 A | 9/1993 | Hamma | |
| 5,266,746 A | 11/1993 | Nishihara et al. | |
| 5,378,862 A | 1/1995 | Tasaka et al. | |
| 5,399,820 A | 3/1995 | Silfvast | |
| 5,698,825 A | 12/1997 | Karasik | |
| 6,111,760 A * | 8/2000 | Nixon | H04B 1/3833 220/4.02 |
| 6,144,552 A | 11/2000 | Whitcher et al. | |
| 6,160,701 A | 12/2000 | Baker et al. | |
| 6,356,313 B1 | 3/2002 | Champion et al. | |
| 6,560,092 B2 | 5/2003 | Itou et al. | |
| 6,586,689 B2 | 7/2003 | Kuriyama | |
| 6,675,755 B2 | 1/2004 | Glovatsky et al. | |
| 6,694,594 B2 | 2/2004 | Chung et al. | |
| 6,771,490 B2 | 8/2004 | Peker et al. | |
| 6,861,591 B2 | 3/2005 | Kusaka | |
| 6,891,718 B2 | 5/2005 | You et al. | |
| 6,996,424 B2 | 2/2006 | Ijäs et al. | |
| 7,010,121 B2 | 3/2006 | Wennemer et al. | |
| 7,148,428 B2 | 12/2006 | Meier et al. | |
| 7,182,500 B2 | 2/2007 | Sugawara | |
| 7,236,356 B2 | 6/2007 | Ulla et al. | |
| 7,248,463 B2 | 7/2007 | Bander et al. | |
| 7,271,861 B2 | 9/2007 | Yamazaki | |
| 7,301,761 B2 | 11/2007 | Merz et al. | |
| 7,446,275 B2 | 11/2008 | Lee et al. | |
| 7,447,040 B2 | 11/2008 | Kim | |
| 7,456,355 B2 | 11/2008 | Blakeway | |
| 7,475,914 B2 | 1/2009 | Pospisil et al. | |
| 7,515,431 B1 | 4/2009 | Zadesky et al. | |
| 7,633,030 B2 | 12/2009 | Chang | |
| 7,656,675 B2 | 2/2010 | Kim et al. | |
| 7,688,574 B2 | 3/2010 | Zadesky et al. | |
| 7,697,281 B2 | 4/2010 | Dabov et al. | |
| 7,733,639 B2 | 6/2010 | Rambosek et al. | |
| 7,864,263 B2 | 1/2011 | Kim | |
| 7,884,297 B2 | 2/2011 | Okuzumi | |
| 7,916,459 B2 | 3/2011 | Lee et al. | |
| 7,937,772 B1 | 5/2011 | Smith et al. | |
| 7,953,804 B2 | 5/2011 | Van Belle et al. | |
| 7,957,769 B2 | 6/2011 | Mochizuki et al. | |
| 7,990,695 B2 | 8/2011 | Lv | |
| 7,995,334 B2 | 8/2011 | McClure et al. | |
| 8,015,852 B2 | 9/2011 | Su | |
| 8,058,571 B2 | 11/2011 | Rajagopal et al. | |
| 8,089,772 B2 | 1/2012 | Chen | |
| 8,120,899 B2 | 2/2012 | Kim | |
| 8,121,483 B2 | 2/2012 | Duricic et al. | |
| 8,171,623 B2 | 5/2012 | McClure et al. | |
| 8,199,468 B2 | 6/2012 | Raff et al. | |
| 8,213,168 B2 | 7/2012 | McClure et al. | |
| 8,238,087 B2 * | 8/2012 | McClure | G06F 1/1613 248/178.1 |
| 8,253,866 B1 | 8/2012 | Weber | |
| 8,345,410 B2 * | 1/2013 | Ternus | G06F 1/1613 248/917 |
| 8,391,010 B2 * | 3/2013 | Rothkopf | G06F 1/1626 313/46 |
| 8,432,678 B2 | 4/2013 | McClure et al. | |
| 8,896,991 B2 * | 11/2014 | Ternus | G06F 1/1613 361/679.02 |
| 9,002,419 B2 * | 4/2015 | Satou | G06F 3/044 455/128 |
| 9,431,190 B2 | 8/2016 | McClure et al. | |
| 2001/0015005 A1 | 8/2001 | Chung et al. | |
| 2002/0059712 A1 | 5/2002 | Chem | |
| 2003/0027589 A1 | 2/2003 | Wennemer et al. | |
| 2003/0084859 A1 | 5/2003 | Glovatsky et al. | |
| 2003/0127245 A1 | 7/2003 | Kusaka | |
| 2004/0240162 A1 | 12/2004 | Hsu et al. | |
| 2005/0212991 A1 | 9/2005 | Sugawara | |
| 2005/0225449 A1 | 10/2005 | Blakeway | |
| 2005/0285991 A1 | 12/2005 | Yamazaki | |
| 2006/0067066 A1 | 3/2006 | Meier et al. | |
| 2006/0120035 A1 | 6/2006 | Merz et al. | |
| 2006/0148425 A1 | 7/2006 | Carlson | |
| 2006/0193109 A1 | 8/2006 | Bander et al. | |
| 2006/0221565 A1 | 10/2006 | Doherty et al. | |
| 2006/0285302 A1 | 12/2006 | Kim | |
| 2007/0111598 A1 | 5/2007 | Quilici | |
| 2007/0121026 A1 | 5/2007 | Chang et al. | |
| 2007/0229475 A1 | 10/2007 | Gettemy et al. | |
| 2007/0240972 A1 | 10/2007 | Lee et al. | |
| 2007/0283044 A1 | 12/2007 | Van Belle et al. | |
| 2008/0055828 A1 | 3/2008 | Yang | |
| 2008/0150371 A1 | 6/2008 | Kim et al. | |
| 2008/0165485 A1 | 7/2008 | Zadesky et al. | |
| 2008/0170377 A1 | 7/2008 | Miyasaka et al. | |
| 2009/0067141 A1 | 3/2009 | Dabov et al. | |
| 2009/0126450 A1 | 5/2009 | Su | |
| 2009/0195974 A1 | 8/2009 | Rambosek et al. | |
| 2009/0197116 A1 * | 8/2009 | Cheng | B32B 15/01 428/651 |
| 2009/0223795 A1 | 9/2009 | Lee et al. | |
| 2009/0257189 A1 | 10/2009 | Wang et al. | |
| 2009/0264160 A1 | 10/2009 | Mochizuki et al. | |
| 2009/0301852 A1 | 12/2009 | Keist et al. | |
| 2010/0061040 A1 | 3/2010 | Dabov et al. | |
| 2010/0084251 A1 | 4/2010 | Rajagopal et al. | |
| 2010/0157522 A1 | 6/2010 | Refai-Ahmed | |
| 2010/0232122 A1 | 9/2010 | Chen | |
| 2010/0265179 A1 | 10/2010 | Ram | |
| 2011/0090627 A1 | 4/2011 | Raff et al. | |
| 2011/0166690 A1 * | 7/2011 | Ternus | G06F 1/1613 700/117 |
| 2012/0168524 A1 | 7/2012 | Moore et al. | |
| 2012/0237267 A1 | 9/2012 | Fukao et al. | |
| 2012/0268882 A1 | 10/2012 | McClure et al. | |
| 2013/0100607 A1 | 4/2013 | Temus et al. | |
| 2014/0063719 A1 * | 3/2014 | Yamazaki | G06F 1/1601 361/679.21 |
| 2015/0365508 A1 * | 12/2015 | Kwon | H04B 1/3888 455/566 |

FOREIGN PATENT DOCUMENTS

| | | |
|---|---|---|
| CN | 1482796 A | 3/2004 |
| CN | 1989474 A | 6/2007 |
| CN | 2938613 Y | 8/2007 |
| CN | 201181435 Y | 1/2009 |
| CN | 101378424 A | 3/2009 |
| CN | 101458365 A | 6/2009 |
| CN | 102117106 A | 7/2011 |

(56) References Cited

FOREIGN PATENT DOCUMENTS

| CN | ZL201020688642.2 | 2/2012 |
|---|---|---|
| DE | 112010005093 T5 | 10/2012 |
| EP | 0090921 A1 | 10/1983 |
| EP | 1791218 A2 | 5/2007 |
| EP | 1884870 A1 | 2/2008 |
| GB | 2490073 A | 10/2012 |
| JP | 2002170494 A | 6/2002 |
| JP | 2003272478 A | 9/2003 |
| JP | 2006112622 A | 4/2006 |

OTHER PUBLICATIONS

Partial Search Report dated Dec. 1, 2010 in PCT Application No. PCT/US2010/046857.
PCT Application No. PCT/US2010/047270—International Search Report and Written Opinion dated Dec. 3, 2010.
PCT Application No. PCT/US2010/047272—International Search Report and Written Opinion dated Dec. 23, 2010.
"Design Guidelines for Flexible Circuits," Electronic Packaging & Production, No. 8, Aug. 1988, Newton Mass.
Partial Search Report dated Dec. 2, 2010 in PCT Application No. PCT /US2010/046939.
PCT Application No. PCT/US2010/046857—International Search Report and Written Opinion, dated Apr. 5, 2011.
PCT Application No. PCT/US2010/046939—International Search Report and Written Opinion dated Feb. 7, 2011.
PCT Application No. PCT/US2010/046928—International Search Report and Written Opinion, dated Apr. 13, 2011.
Search Report dated Dec. 2, 2011 for Chinese Utility Model Patent No. ZL201020688636.7.
Written Opinion dated Feb. 2, 2012 in PCT Application No. PCT/US2010/04685.
Evaluation Report dated Apr. 1, 2012 for CN Application No. ZL201020688628.2.
Evaluation Report dated Mar. 12, 2012 for CN Application No. ZL201020688642.2.
First Office Action for CN Application No. 201010613190.6 dated Aug. 21, 2012.
Office Action for GB Application No. GB1213905.1 dated Sep. 5, 2012.
Communication of European Publication Number and Information on the Application of Article 67(3) EPC for European Application No. 10754615.2, dated Oct. 17, 2012.
Notification of the First Office Action in Chinese Application No. CN201010613188.9 dated May 2, 2012.
Written Opinion in PCT Application No. PCT/US2010/046857 dated Mar. 2, 2012.
Chinese Application No. 201010613190.6—Office Action dated Mar. 1, 2013.
Chinese Application No. 201010613190.6—Rejection Decision dated Sep. 5, 2013.
Australian Application No. 2010340305—Patent Examination Report No. 1 dated Jun. 21, 2013.
Australian Patent Application No. 2014203370—Patent Examination Report dated May 12, 2015.

\* cited by examiner

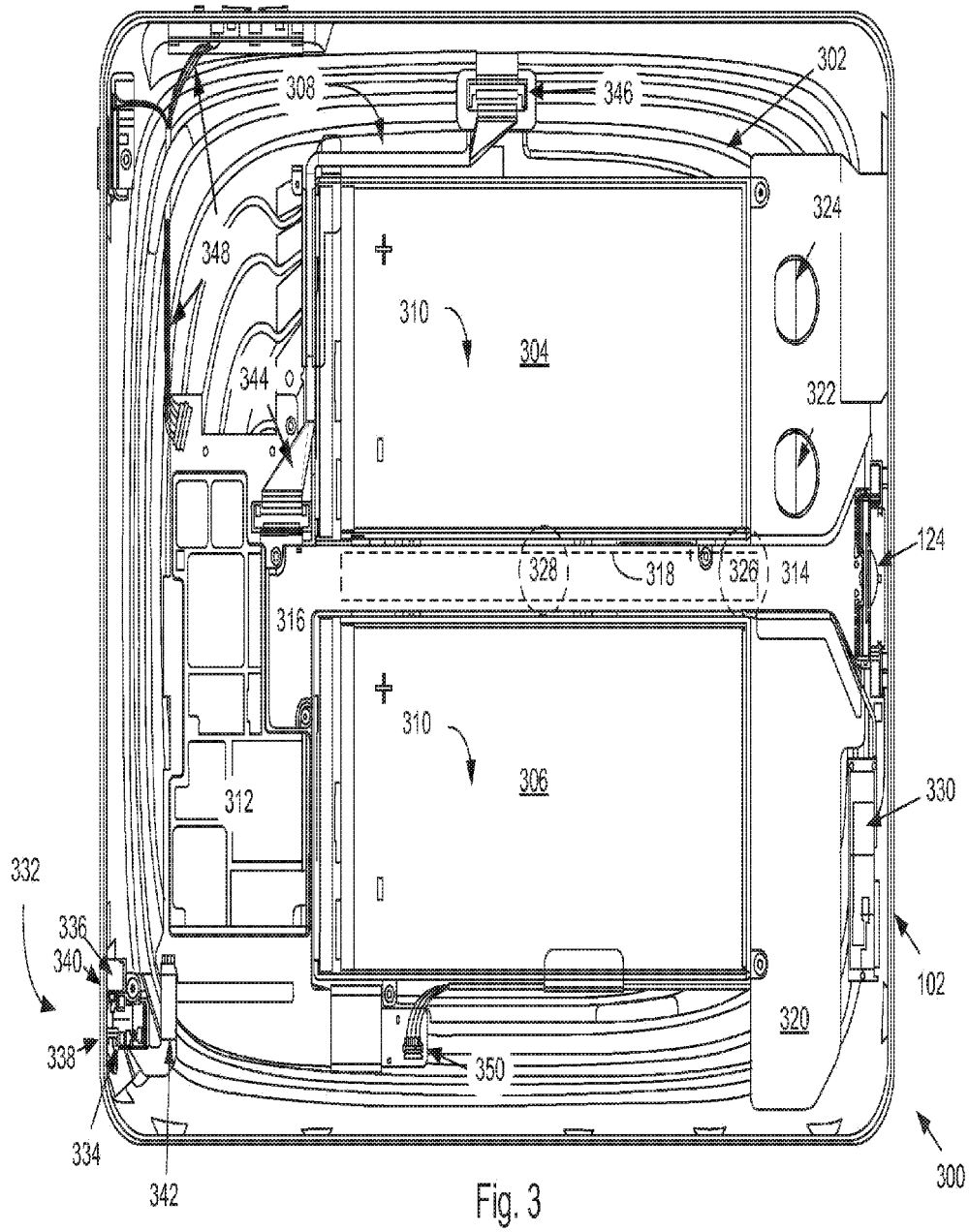

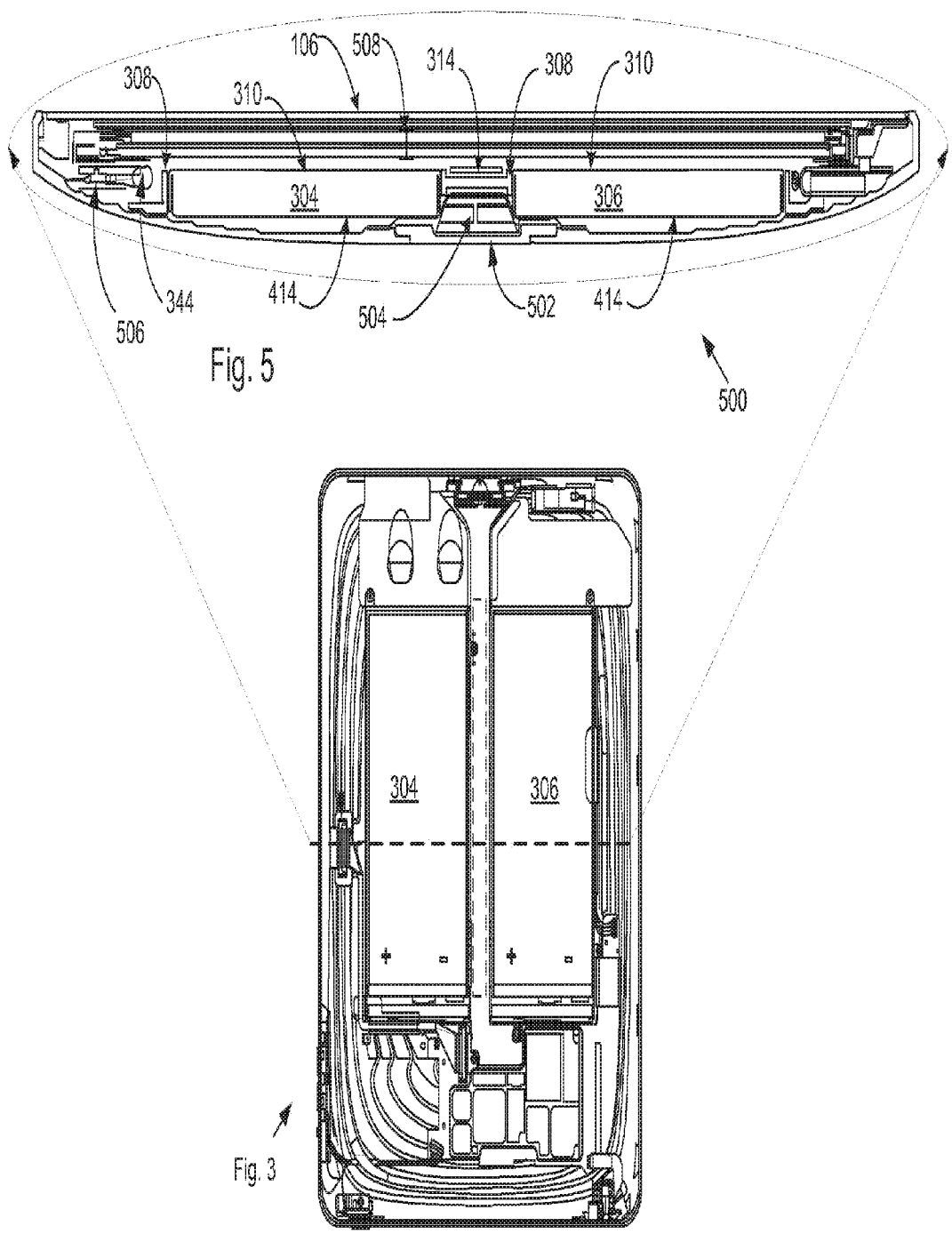

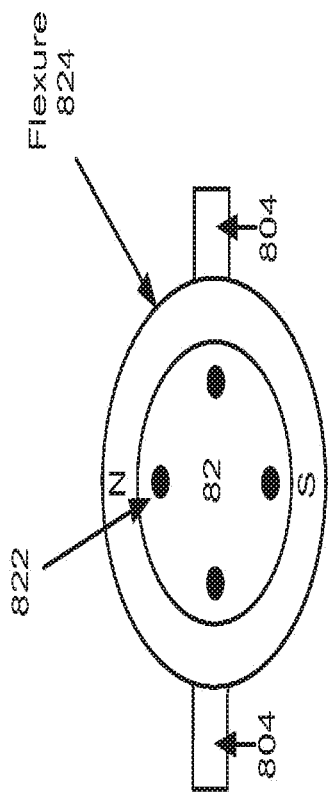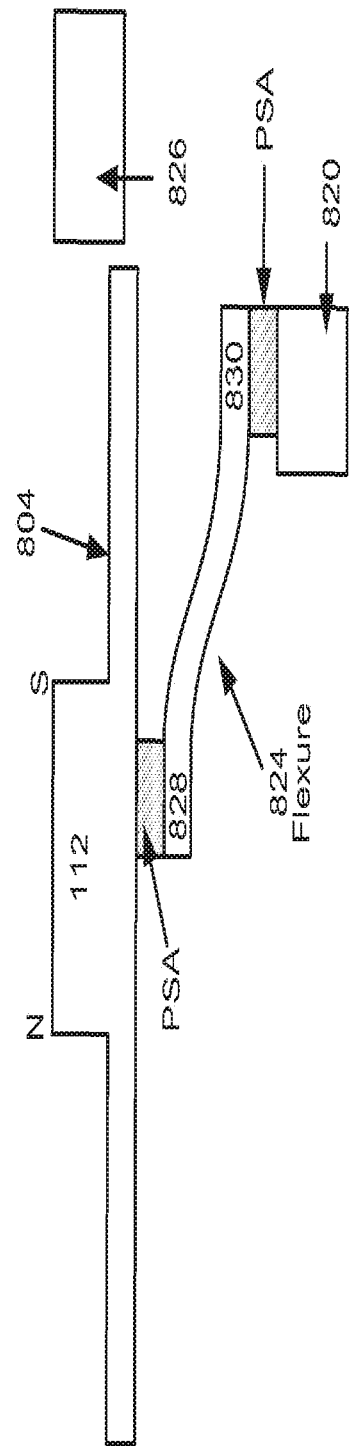

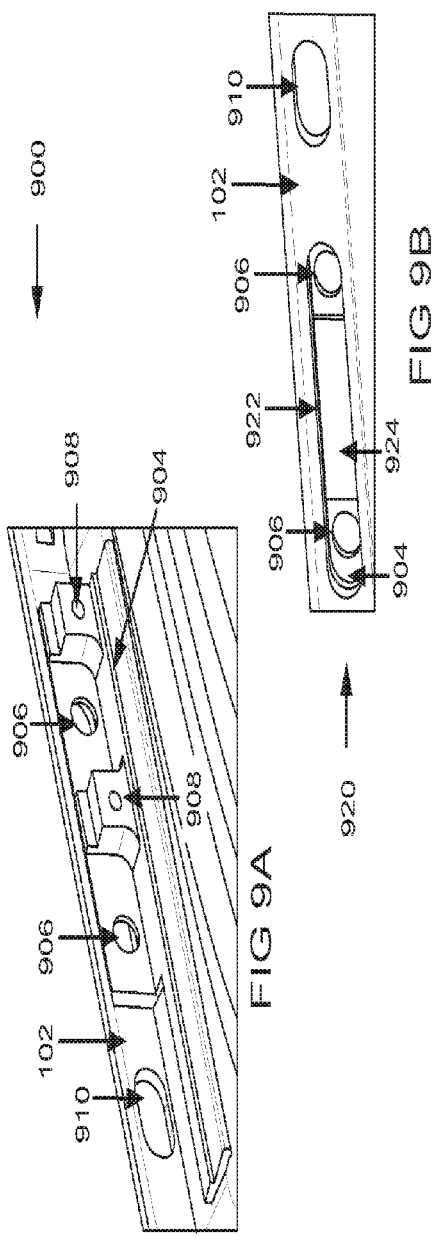
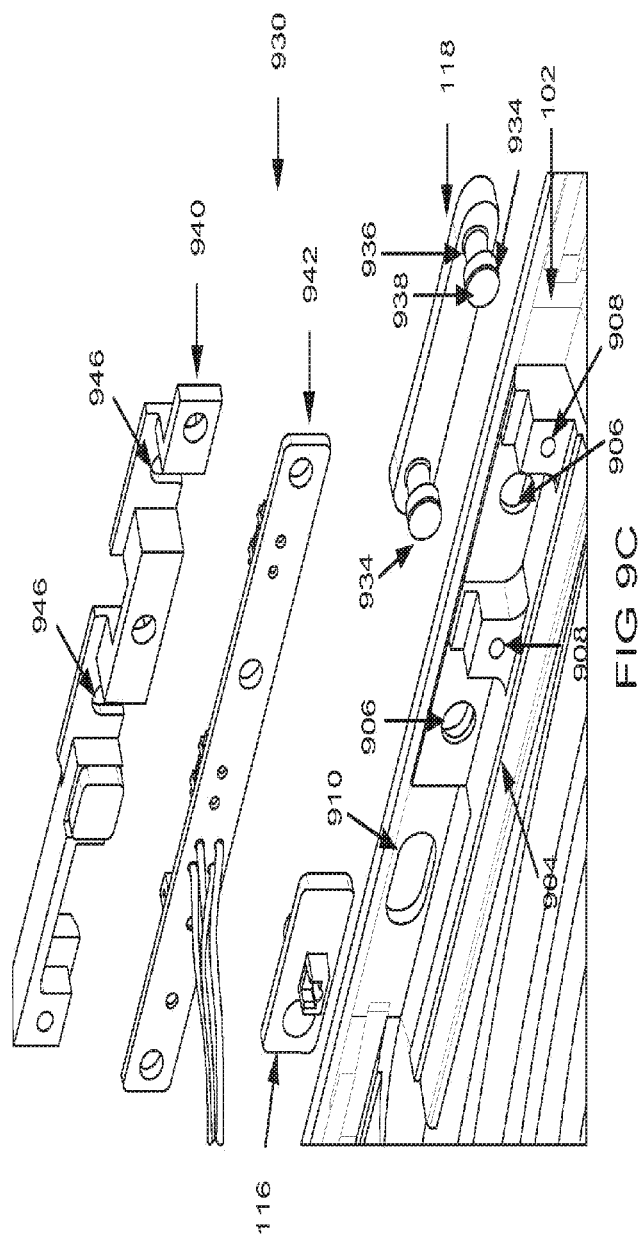

COMPONENT ASSEMBLY

CROSS REFERENCE TO RELATED APPLICATIONS

This application is a continuation of U.S. patent application Ser. No. 13/855,630 filed Apr. 2, 2013, which is a continuation of U.S. patent application Ser. No. 12/694,200 filed Jan. 26, 2010 and issued Apr. 30, 2013 as U.S. Pat. No. 8,432,678, which claims the benefit of U.S. Provisional Patent Application No. 61/292,739 filed Jan. 6, 2010, all of which are incorporated by reference herein in their entireties.

This patent application is related to and incorporates by reference in their entirety the following co-pending patent applications:
  (i) U.S. patent application Ser. No. 12/694,162 entitled "ASSEMBLY OF A DISPLAY MODULE" by Ternus et al. filed Jan. 26, 2010;
  (ii) U.S. patent application Ser. No. 12/694,085 entitled "HANDHELD COMPUTING DEVICE" by Ternus et al. filed Jan. 26, 2010;
  (iii) U.S. patent application Ser. No. 12/694,168 entitled "DISPLAY MODULE" by McClure et al. filed Jan. 26, 2010;
  (iv) U.S. patent application Ser. No. 12/694,166 entitled "PRINTED CIRCUIT BOARD" by McClure et al. filed Jan. 26, 2010; and
  (v) U.S. patent application Ser. No. 12/694,083; and entitled "EDGE BREAK DETAILS AND PROCESSING" by Sweet et al. filed Jan. 26, 2010 that is, in turn, a continuation in part of U.S. patent application Ser. No. 12/580,934 entitled "METHOD AND APPARATUS FOR POLISHING A CURVED EDGE" by Lancaster et al. filed Oct. 16, 2009 that takes priority under 35 U.S.C. 119(e) to U.S. Provisional Patent Application Ser. No. 61/249,200 entitled "COMPLEX GEOGRAPHICAL EDGE POLISHING" by Johannessen filed Oct. 6, 2009.

BACKGROUND

Field of the Described Embodiments

The described embodiments relate generally to portable computing devices such as laptop computers, tablet computers, and the like. More particularly, enclosures of portable computing devices and methods of assembling portable computing devices are described.

Description of the Related Art

In recent years, portable computing devices such as laptops, PDAs, media players, cellular phones, etc., have become small, light and powerful. One factor contributing to this reduction in size can be attributed to the manufacturer's ability to fabricate various components of these devices in smaller and smaller sizes while in most cases increasing the power and or operating speed of such components. The trend of smaller, lighter and powerful presents a continuing design challenge in the design of some components of the portable computing devices.

One design challenge associated with the portable computing device is the design of the enclosures used to house the various internal components. This design challenge generally arises from a number conflicting design goals that includes the desirability of making the enclosure lighter and thinner, the desirability of making the enclosure stronger and making the enclosure more esthetically pleasing. The lighter enclosures, which typically use thinner plastic structures and fewer fasteners, tend to be more flexible and therefore they have a greater propensity to buckle and bow when used while the stronger and more rigid enclosures, which typically use thicker plastic structures and more fasteners, tend to be thicker and carry more weight. Unfortunately, however, the increased weight consistent with the more rugged enclosure can lead to user dissatisfaction whereas bowing of enclosures formed of lightweight material can result in damaging some of the internal components (such as printed circuit boards) of the portable device.

Furthermore, the enclosures are mechanical assemblies having multiple parts that are screwed, bolted, riveted, or otherwise fastened together at discrete points. These assembly techniques typically complicate the housing design and create aesthetic difficulties because of undesirable cracks, seams, gaps or breaks at the mating surfaces and fasteners located along the surfaces of the housing. For example, a mating line surrounding the entire enclosure is produced when using an upper and lower casing. Moreover, the various components and complicated processes used to manufacture the portable device can make assembly a time consuming and cumbersome process requiring, for example, a highly trained assembly operator working with special tools.

Another challenge is related to techniques for mounting structures within the portable computing devices. Conventionally, the structures have been laid over one of the casings (upper or lower) and attached to one of the casings with fasteners such as screws, bolts, rivets, etc. That is, the structures are positioned in a sandwich like manner in layers over the casing and thereafter fastened to the casing. This methodology suffers from the same drawbacks as mentioned above, i.e., assembly is a time consuming and cumbersome process.

In view of the foregoing, there is a need for improved component density and associated assembly techniques that reduce cost and improve outgoing quality. In addition, there is a need for improvements in the manner in which handheld devices are assembled such as improvements that enable structures to be quickly and easily installed within the enclosure. It is also desirable to minimize the Z stack height of the assembled components in order to reduce the overall thickness of the portable computing device and thereby improve the overall aesthetic look and feel of the product.

SUMMARY OF THE DESCRIBED EMBODIMENTS

A portable computing device is disclosed. The portable computing device can take many forms such as a laptop computer, a tablet computer, and so on. In one embodiment, the portable computing device can include a single piece housing having a front opening. In the described embodiment, the single piece housing can, in turn, include an integral bottom and side walls that cooperate to form a cavity in cooperation with the front opening where an interior surface of the bottom wall is curved and includes a plurality of machined steps suitable for mounting an internal component thereon where at least some of the machined steps form a pattern of steps. In addition to the single piece housing, the portable computing device can include a component mounted directly to the curved bottom wall. The component, in turn, includes a mounting feature having a shape that conforms to the pattern of steps such that the mounting feature is directly mounted to the bottom wall of the single piece housing without conforming to the curvature of the bottom wall.

In one aspect, the steps can be machined in one set up using computer numerical controlled (CNC) machine tools and associated techniques. In addition, any sharp edges can be rounded to a more benign shape thereby reducing any possibility of damaging internal components.

In another embodiment, a button assembly is described. The button assembly can include at least a button body having an external top surface configured to be pressed by a user, at least one tactile switch unit, mounted on a top surface of a first printed circuit board positioned such that a bottom surface of the button body can contact the tactile switch unit when the top surface of the button body is pressed by the user, and a plurality of conductive posts mounted on a top surface of a second printed circuit board positioned and connected to a bottom surface of the first printed circuit board through a plurality of conductive pads mounted thereon. In the described embodiment, when a current passes through at least two of the plurality of conductive posts when the user presses the external top surface of the button body thereby closing a circuit in the tactile switch unit.

In another embodiment, a button assembly is described that includes at least a button body including an exterior surface and at least one post extending from a interior surface opposite the exterior surface, the at least one post having a stem portion proximal to the interior surface and a capture portion distal to the interior surface, the capture portion having a diameter greater than the stem portion, a structural support section having a first opening wider than the capture portion of the post of the button body and configured to provide structural stability to a section of a housing to which the structural support section is mounted, the section of the housing having a second opening larger than the exterior surface of the button body, and a retention bracket having a third opening wider than the diameter of the stem portion and narrower than the diameter of the capture portion of the post. In the described embodiment, the button assembly can be at least partially assembled by extending the post of the button body through the second opening in the housing and the first opening in the structural support section and retained in position by the retention bracket.

In still another embodiment, a method is described. The method can be carried out by receiving a housing having a cavity for receiving internal components, the housing having a plurality of mounting steps formed on a curved interior bottom surface of the housing. A component to be mounted to the housing is then received, the component having a conformally shaped mounting feature. The conformally shaped mounting feature is then placed in contact with at least one of the mounting steps and bonded to the bottom surface of the housing. In this way, the mounting feature is directly mounted to the bottom wall of the single piece housing without conforming to the curvature of the bottom wall.

In one aspect, an integrated beam system can be formed by removing less than the determined amounts of material from an inner surface of the housing. The integrated beam system can be part of the housing and be used to provide support for the housing by, in part, distributing a force applied to the portable computing device. In this way, by distributing the applied force, the risk of deforming or damaging the housing can be substantially reduced.

BRIEF DESCRIPTION OF THE DRAWINGS

The embodiments will be readily understood by the following detailed description in conjunction with the accompanying drawings, wherein like reference numerals designate like structural elements, and in which:

FIG. 3 presents a top level internal view of portable computing device showing a specific arrangement of various internal components.

FIG. 5 shows cross section along line AA of FIG. 3.

FIG. 8C illustrates a top view of a portion of the button assembly of FIG. 8A.

FIG. 8D illustrates a simplified cross-sectional view through a portion of the button assembly of FIG. 8A.

FIG. 9A presents a perspective internal view of a reinforced housing of a portable computing device in the region of a button assembly.

FIG. 9B presents a perspective external view of the reinforced housing of the portable computing device illustrated in FIG. 9A.

FIG. 9C illustrates an exploded perspective internal view of a button assembly mountable through the reinforced housing 102 of the portable computing device 100 illustrated in FIGS. 9A-B.

DESCRIBED EMBODIMENTS

Figure 1A:
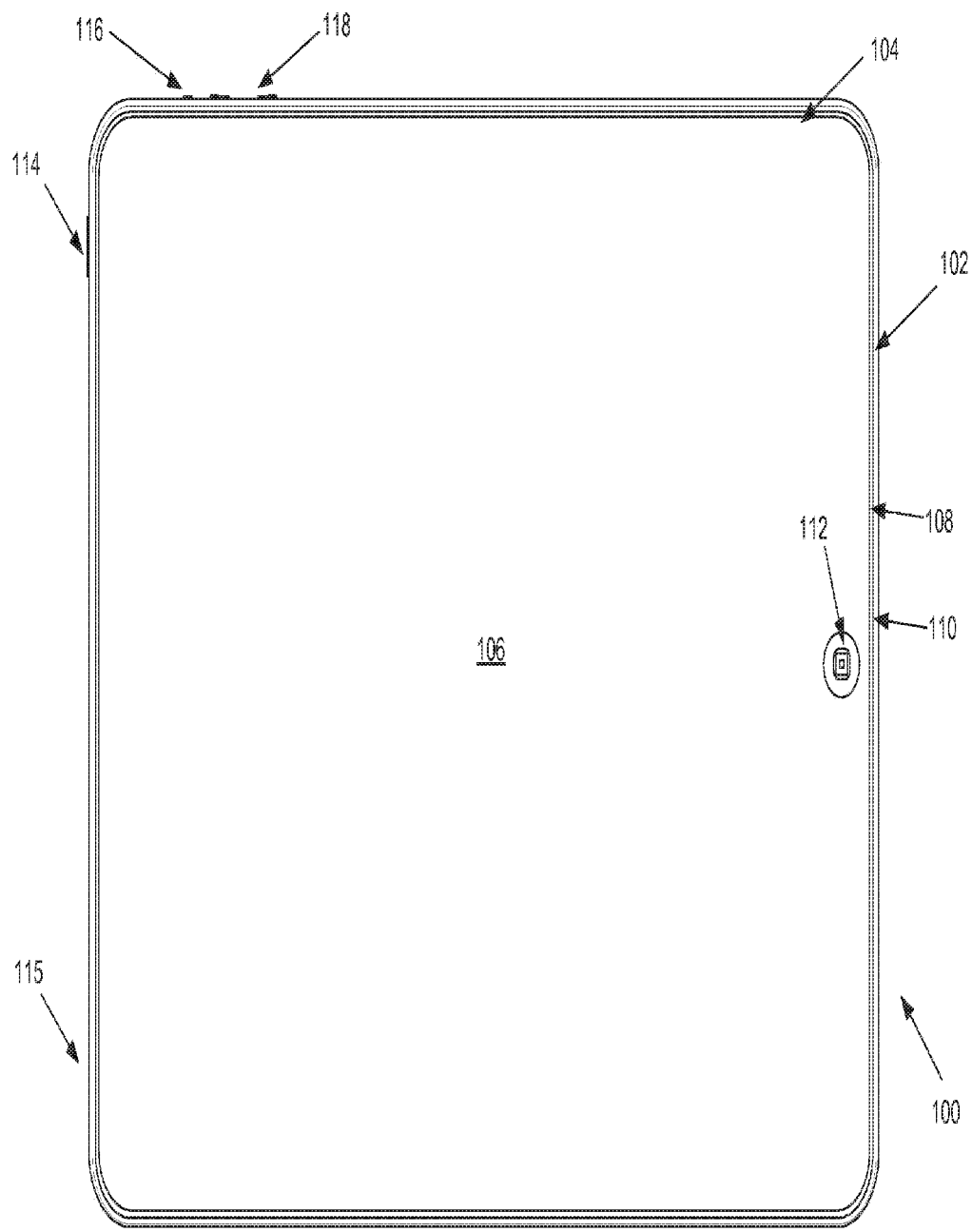
FIG. 1A shows a top view of a portable computing device in accordance with the described embodiments.

In the following paper, numerous specific details are set forth to provide a thorough understanding of the concepts underlying the described embodiments. It will be apparent, however, to one skilled in the art that the described embodiments may be practiced without some or all of these specific details. In other instances, well known process steps have not been described in detail in order to avoid unnecessarily obscuring the underlying concepts.

This paper discusses an aesthetically pleasing portable computing device that is easy to carry with one hand and operate with the other. The portable computing device can be formed of a single piece seamless housing and an aesthetically pleasing protective top layer that can be formed of any of a number of durable and strong yet transparent materials such as highly polished glass or plastic. For the remainder of this discussion, however, the protective top layer can take the form of highly polished cover glass without any loss in generality. Furthermore, the uniformity of the appearance of the portable computing device can be enhanced since (unlike conventional portable computing devices) the cover glass can be mounted to the single piece seamless housing without the use of a bezel. This simplicity of design can accrue many advantages to the portable computing device besides those related to aesthetic look and feel. For example, fewer components and less time and effort can be required for assembly of the portable computing device, and the absence of seams in the single piece housing can provide good protection against environmental contamination of internal components. Moreover, the ability of the portable computing device to successfully withstand applied loads (such as from day to day use) as well as those from less frequent but potentially more damaging events such as being dropped can be substantially improved over conventional portable computing devices.

In the described embodiments, the single piece seamless housing can be formed from plastic or metal. In the case where the single piece seamless housing is formed of metal, the metal can take the form of a single sheet (such as aluminum). The single sheet of metal can be formed into a shape appropriate for housing various internal components as well as providing various openings into which switches, connectors, displays, and so on can be accommodated. The single piece seamless housing can be forged, molded, or otherwise processed into a desired shape. The shape of the housing can be asymmetric in that an upper portion of the housing can formed to have a substantially different shape than that exhibited by a lower portion of the housing. For example, the upper portion of the housing can have surfaces that meet at distinct angles forming well defined boundary whereas the lower portion can be formed to have a surface with a spline shape. The transition zone between the upper portion having distinct edges and the lower, spline shaped portion can take the form of an edge having a rounded shape providing both a natural change from the upper portion of the housing (i.e., the area of distinct edges) and the smoother surface presented by the lower portion of the housing. It should also be noted that in addition to providing a more aesthetically pleasing transition, the rounded shape of the edge in the transition zone can provide a more comfortable feel when being held in a user's hand either during use or merely being carried about. One of the advantages to using metal for the housing is ability of metal to provide good electrical grounding for any internal components requiring a good ground plane. For example, performance of a built in RF antenna can be substantially improved when a good ground plane is provided. Moreover, a good ground plane can be used to help mitigate the deleterious effects caused by, for example, of electromagnetic interference (EMI) and/or electrostatic discharge (ESD).

It should be noted that throughout the following discussion, the term "CNC" is used. The abbreviation CNC stands for computer numerical control and refers specifically to a computer controller that reads computer instructions and drives a machine tool (a powered mechanical device typically used to fabricate components by the selective removal of material). It should be noted however, that any appropriate machining operation can be used to implement the described embodiments and is not strictly limited to those practices associated with CNC.

These and other embodiments are discussed below with reference to FIGS. 1-xx. However, those skilled in the art will readily appreciate that the detailed description given herein with respect to these figures is for explanatory purposes only and should not be construed as limiting.

FIG. 1A illustrates a specific embodiment of portable computing device 100. More specifically, FIG. 1A shows a full top view of fully assembled portable computing device 100. Portable computing device 100 can process data and more particularly media data such as audio, video, images, etc. By way of example, portable computing device 100 can generally correspond to a device that can perform as a music player, game player, video player, personal digital assistant (PDA), tablet computer and/or the like. With regards to being handheld, portable computing device 100 can be held in one hand by a user while being operated by the user's other hand (i.e., no reference surface such as a desktop is needed). For example, the user can hold portable computing device 100 in one hand and operate portable computing device 100 with the other hand by, for example, operating a volume switch, a hold switch, or by providing inputs to a touch sensitive surface such as a display or pad.

Portable computing device 100 can include single piece seamless housing 102 that can be formed of any number of materials such as plastic or metal which can be forged, molded, or otherwise processed into a desired shape. In those cases where portable computing device 100 has a metal housing and incorporates RF based functionality, it may be advantageous to provide at least a portion of housing 102 in the form of radio (or RF) transparent materials such as ceramic, or plastic. In any case, housing 102 can be configured to at least partially enclose any suitable number of internal components associated with the portable computing device 100. For example, housing 102 can enclose and support internally various structural and electrical components (including integrated circuit chips and other circuitry) to provide computing operations for portable computing device 100. The integrated circuits can take the form of chips, chip sets, modules any of which can be surface mounted to a printed circuit board, or PCB, or other support structure. For example, a main logic board (MLB) can have integrated circuits mounted thereon that can include at least a microprocessor, semi-conductor (such as FLASH) memory, various support circuits and so on.

Housing 102 can include opening 104 for placing internal components and may be sized to accommodate a display assembly or system suitable for providing a user with at least visual content as for example via a display. In some cases, the display system can include touch sensitive capabilities providing the user with the ability to provide tactile inputs to portable computing device 100 using touch inputs. The display system can be formed of a number of layers including a topmost layer taking the form of transparent protective layer 106 formed of polycarbonate or other appropriate plastic or highly polished glass. Using highly polished glass, protective layer 106 can take the form of cover glass 106 substantially filling opening 104. Seal 108 can be used to form a gasket between cover glass 106 and housing 102. Seal 108 can be formed of a resilient material such as a plastic along the lines of thermoplastic urethane or TPU. In this way, seal 108 can provide protection against environmental contaminants from entering the interior of portable computing device 100. Racetrack 110 can be defined as the uppermost portion of the housing 102 that surrounds cover glass layer 106. In order to maintain the desired aesthetic look and feel of portable computing device 100, it is desirable that any offsets between the housing 102 and cover glass 106 be minimized by centering racetrack 110.

Although not shown, the display panel underlying cover glass 106 can be used to display images using any suitable display technology, such as LCD, LED, OLED, electronic or e-inks, and so on. Display assembly may be placed and secured within the cavity using a variety of mechanisms. In one embodiment, the display system is snapped into the cavity. It may be placed flush with the adjacent portion of the housing. In this way, the display can present visual content that can include video, still images, as well as icons such as graphical user interface (GUI) that can provide information the user (e.g., text, objects, graphics) as well as receive user provided inputs. In some cases, displayed icons can be moved by a user to a more convenient location on the display. For example, GUI can be moved by the user manually dragging GUI from one location to a more convenient location. The display can also provide a user with tactile feedback provided by a number of haptic actuators usually, but not always, arranged in an array of haptic actuators incorporated into the display. In this way, the haptic actuators can provide the user with tactile feedback.

In some embodiments, a display mask (not shown) can be applied to, or incorporated within or under cover glass 106. The display mask can be used to accent an unmasked portion of the display used to present visual content. The display mask can be used to make less obvious home button 112 used to provide a specific input such as change display mode, for example to portable computing device 100. The display mask can render home button 112 less obvious by, for example, being closer in tone or color to home button 112. For example, if home button 112 is formed of a material that is somewhat darker (such as gray or black) than cover glass 106, then using a similarly colored display mask can reduce the visual impact of home button 112 when compared with the unmasked portion of cover glass 106. In this way, the visual impact of home button 112 can be reduced by being integrated into the overall look of the display mask. Furthermore, the display mask can provide a natural mechanism for directing the attention of a viewer to the unmasked area of the display used to present visual content.

Portable computing device 100 can include a number of mechanical controls for controlling or otherwise modifying certain functions of portable computing device 100. For example, power switch 114 can be used to manually power on or power off portable computing device 100. Mute button 116 can be used to mute any audio output provided by portable computing device 100 whereas volume switch 118 can be used to increase/decrease volume of the audio output by portable computing device 100. It should be noted that each of the above described input mechanisms are typically disposed through an opening in housing 102 such that they can couple to internal components in some embodiments, portable computing device 100 can include a camera module configured to provide still or video images. The placement may be widely varied and may include one or more locations including for example front and back of the device, i.e., one through the back housing, the other through the display window.

Portable computing device 100 can include a mechanism for wireless communications, as either a transceiver type device or receiver only, such as a radio, portable computing device 100 can include an antenna that can be disposed internal to a radio transparent portion of housing 102. In some embodiments, an antenna can be incorporated into seal 108 or cover glass 106. In other embodiments, a portion of housing 102 can be replaced with radio transparent material in the form of an antenna window described in more detail below. The radio transparent material can include, for example, plastic, ceramic, and so on. The wireless communications can be based on many different wireless protocols including for example 3G, 2G, Bluetooth, RF, 802.11, FM, AM, and so on. Any number of antennae may be used, which can use a single window or multiple windows depending on the needs of the system. In one embodiment, the system can include at least first and second antenna windows built into the housing.

Figure 1B:
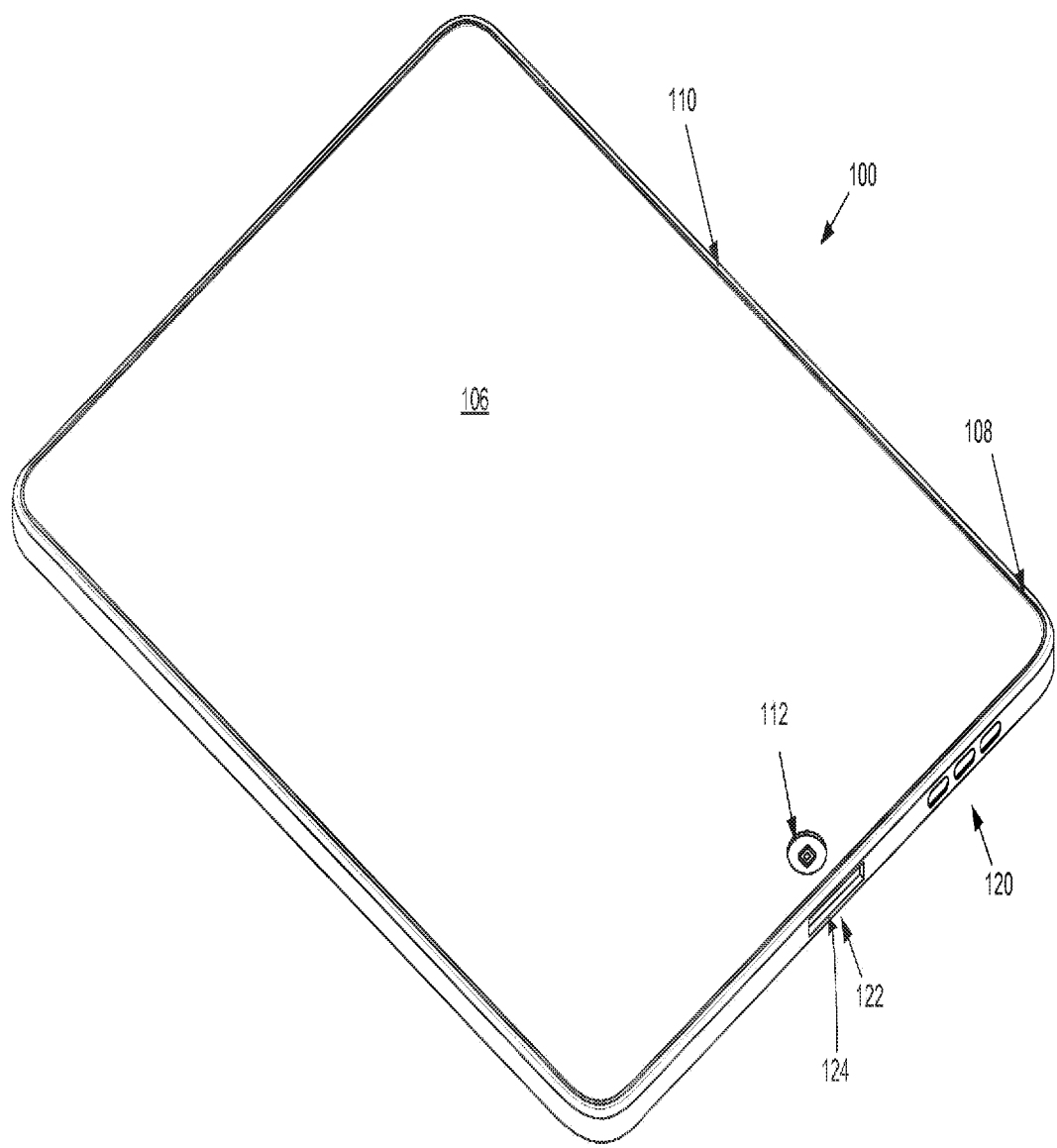
FIG. 1B shows a perspective top view of a portable computing device in accordance with the described embodiments.

FIG. 1B shows a perspective top view of portable computing device 100 in accordance with the described embodiments. As shown in FIG. 1B, portable computing device 100 can include one or more speakers 120 used to output audible sound. Portable computing device 100 can also include one or more connectors for transferring data and/or power to and from portable computing device 100. For example, portable computing device 100 can include multiple data ports, one for each configuration of portrait mode and landscape mode. However, the currently described embodiment includes single data port 122 that can be formed of connector assembly 124 accommodated within an opening formed along a first side of housing 102. In this way, portable computing device 100 can use data port 122 to communicate with external devices when portable computing device 100 is mounted in docking station. It should be noted that in some cases, portable computing device 100 can include an orientation sensor or an accelerometer that can sense the orientation or movement of portable computing device 100. The sensor can then provide an appropriate signal which will then cause portable computing device 100 to present visual content in an appropriate orientation.

Connector assembly 124 can be any size deemed appropriate such as, for example, a 30 pin connector. In some cases, the connector assembly 124 can serve as both a data and power port thus obviating the need for a separate power connector. Connector assembly 124 can be widely varied. In one embodiment, connector assembly 124 can take the form of a peripheral bus connector, such as a USB or FIREWIRE connector. These types of connectors include both power and data functionality, thereby allowing both power delivery and data communications to occur between the portable computing device 100 and the host device when the portable computing device 100 is connected to the host device. In some cases, the host device can provide power to the media portable computing device 100 that can be used to operate the portable computing device 100 and/or charge a battery included therein concurrently with the operating.

Figure 2A:
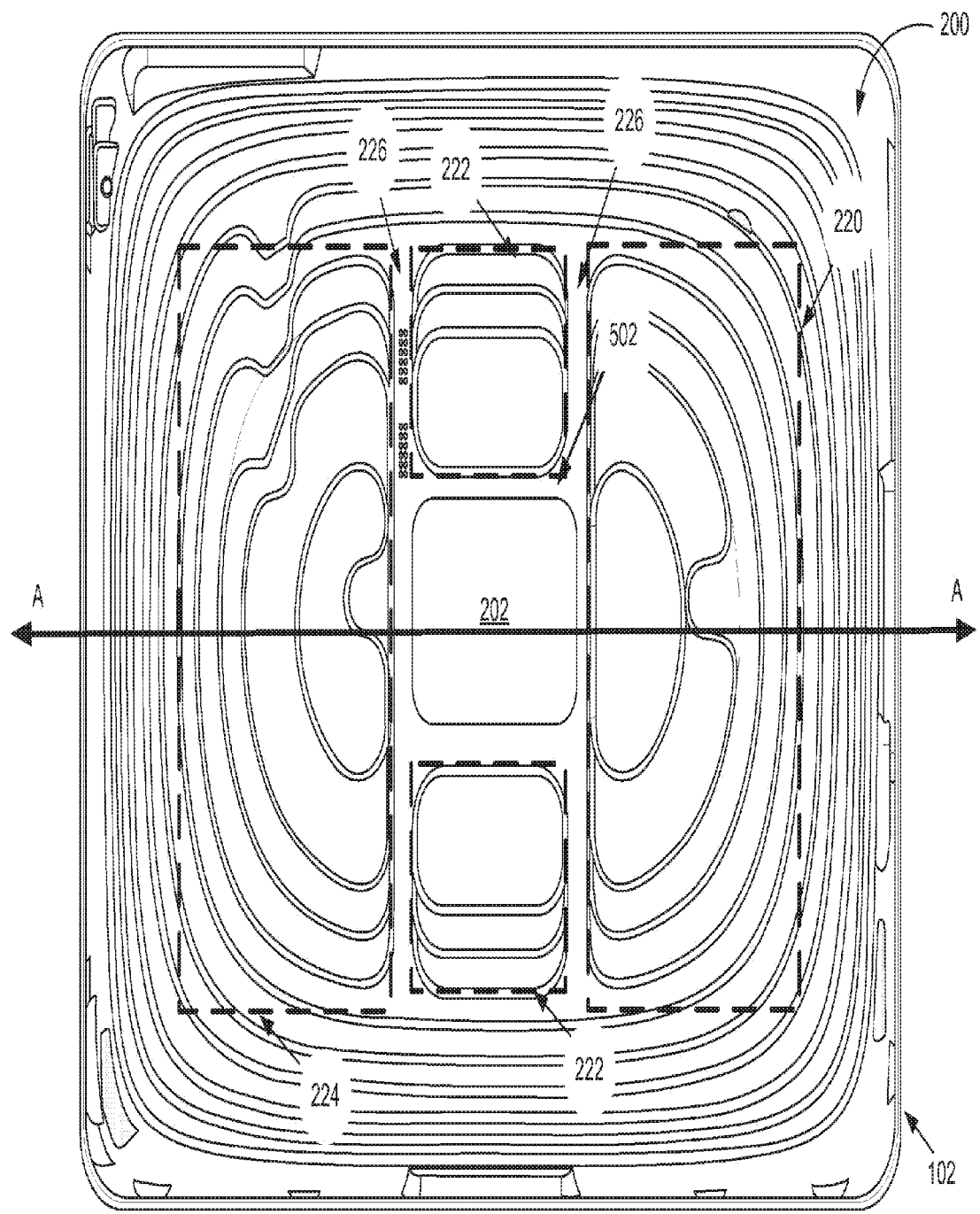
FIG. 2A shows a full interior view of a housing suitable for enclosing operational components of the portable computing device shown in FIGS. 1A and 1B.
Figure 2B:
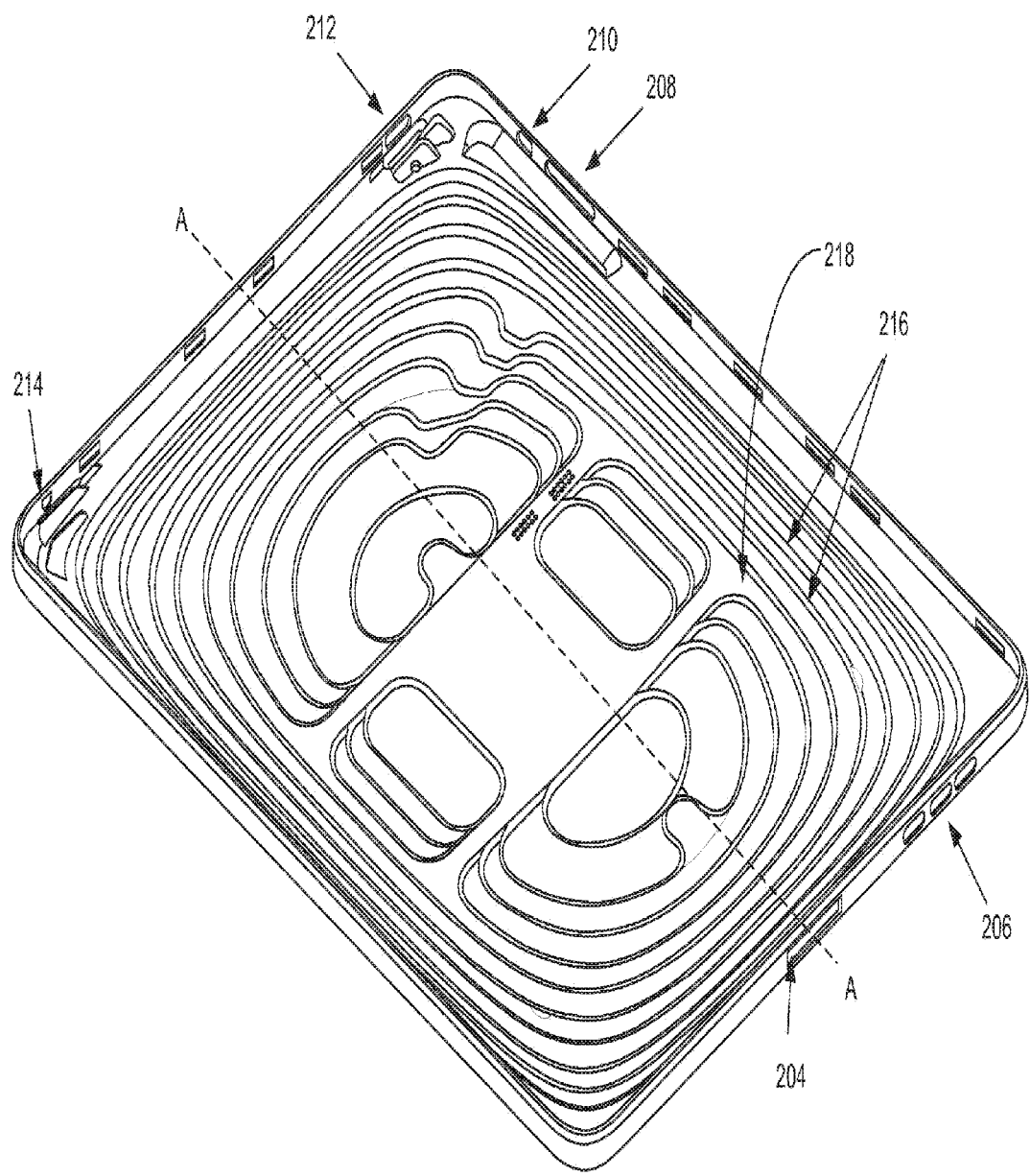
FIG. 2B shows a perspective interior view of a housing suitable for enclosing operational components of the portable computing device shown in FIGS. 1A and 1B.

FIGS. 2A and 2B present a representative interior view of cavity (also referred to as lumen) 200 of single piece seamless housing 102 used to enclose various internal components of the portable computing device 100 shown in FIGS. 1A and 1B. In the described embodiment, single piece seamless housing 102 can be formed from a single sheet of metal (such as aluminum) and formed into an appropriate shape using, for example, using conventional collapsible core metal forming techniques well known to those skilled in the art. Housing 102 can include a number of features used to facilitate the installation of internal components used in the assembly of portable computing device 100. For example, opening 202 can be formed in housing 102 suitably sized and located for an RF antenna. In the case where opening 202 is used for placing an RF antenna, opening 202 can support an RF antenna support assembly formed of at least some radio transparent material. In this way, the RF antenna support assembly can facilitate unimpeded transmission and reception of RF energy in support of any number of wireless protocols such as WiFi, Blue Tooth, and so on. It should be noted the ability to provide unfettered RF functionality is especially important when housing 102 is formed of radio opaque materials such as most metals.

In order to accommodate various interfaces (dock, audio jack, volume, power, mute, and so on), FIG. 2B shows how openings of various sizes can be created in the housing 102. For example, opening 204 can be used to support data port 122, openings 206 can be used to provide support for speakers 120; opening 208 can provide support for volume switch 118 and opening 210 for mute button 116. Furthermore, opening 212 can be used to provide support for power switch 114 and opening 214 for an audio jack. It should be noted that any number of approaches can be used to create these openings and make the opening trim appear to be thicker than the thickness (about 1.5 mm) of the sheet metal used to create housing 102. Creating these openings in the housing 102, however, can result in long and thin webs of metal that can deform from the impact of a drop event or cause housing 102 to exhibit unacceptable flexing under torsion. A particular reinforcing technique is described below.

A plurality of steps 216 can be formed in bottom surface 218 of housing 102. Steps 216 can be used to provide a support platform for mounting various internal components onto bottom surface 218 of housing 102. In the described embodiment, steps 216 can be formed by removing a pre-determined amount of housing material (such as aluminum) using conventional machining techniques. Typically, each of the steps can have rounded edges in order to protect internal components that may come in contact. As is apparent in FIGS. 2A and 2B, steps 216 can also be formed into various patterns, such as pattern 220, 222 and pattern 224. Far from being merely aesthetic in nature, the various patterns can be very useful. For example, the various patterns can be used to accommodate mounting structures used to support internal components, such as for example a battery frame. In some cases, pattern 226 can take the form of an integrated beam structure described in more detail below that provides for a more even distribution of loads applied to housing 102. Moreover, in addition to providing structural support and aiding in resisting deformation, the housing material removed in the formation of the plurality of steps 216 can help to substantially reduce the overall weight of housing 102.

Figure 2D:
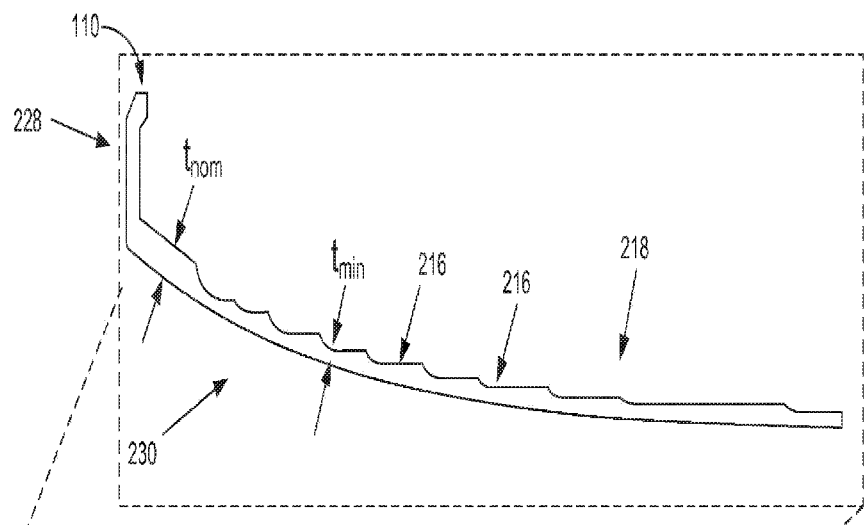
FIGS. 2C and 2D show representative cross sectional view of section A-A of the housing shown in FIG. 2A.
Figure 2C:
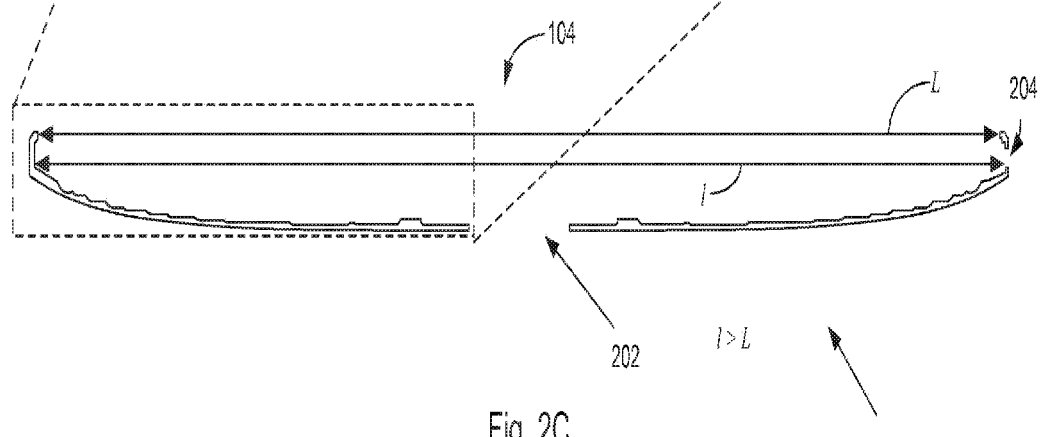

FIGS. 2C and 2D show shows a cross sectional view of housing 102 taken along line A-A of FIGS. 2A and 2B. In particular, FIG. 2C shows the nature of the undercut geometry of housing 102 illustrating more clearly how linear dimensions (length L, for example) of opening 104 into which the operational components can be inserted during assembly is smaller than the linear dimensions (length l, for example) of the body of the housing 102. Moreover, the curvature of housing 102 can be asymmetric in that upper portion 228 of housing 102 can be formed to have distinct edges whereas lower portion 230 can be formed to have spline shape. This asymmetry aids in the tactile sensation presented by portable computing device 100 in part because it provides a better fit to the user's hand.

In any case, housing 102 can have a nominal wall thickness tnom, (that can be on the order of about 1.5 mm). Upper portion 228 can be formed in such a way as to have a substantially uniform average wall thickness close to nominal wall thickness tnom. Since interior surface 218 of lower portion 230 substantially conforms to the spline shape of exterior surface of housing 102, mounting internal components onto interior surface 218 can be difficult or at best sub-optimal. For example, in order to securely place an internal component onto interior surface 218, any mounting structure used to mount the internal component to internal surface 218 would have to be specially machined to fit the curvature of interior surface 218. This special machining would require special tooling and add extra costs to manufacture as well as adding complexity and time required for assembly.

Therefore, in order provide a more suitably shaped interior surface upon which to mount internal components (as well as to reduce the weight of housing 102), interior surface 218 of housing 102 can be sculpted (using CNC machining techniques, for example) to any appropriate shape. Interior surface 218 can be sculpted to include plurality of mounting steps 216 that can resemble in form a terrace. Firstly, however, a determination can be made of a minimum thickness tmin for housing 102 that is consistent with both good structural integrity and a desired weight reduction. For example, in the case where housing 102 is formed of aluminum having nominal thickness tnom of about 1.5 mm, it has been determined that minimum thickness tmin of about 0.6 mm results in an average step height "h" of about 0.5 mm resulting in an average weight reduction of about 25%. Using these settings, interior surface 218 of housing 102 can be machined in one machine set up to include a suitable number of steps each having step height h creating various terracing patterns well suited for both reducing the overall weight of housing 102 but also providing suitable mounting platforms for mounting various internal components.

Portions of interior surface 218 can be maintained at a thickness that is substantially the same as nominal thickness tnom. For example, in order to distribute any stresses applied to housing 102 more evenly, integrated beam system (which in FIG. 2A pattern 226 that resembles the letter "H") can be created simply by not machining those portions of housing 102 consistent with the desired location of integrated beam system. In some cases, however, integrated beam system can be created by simply removing less material from housing 102 in those locations corresponding to integrated beam system such that thickness t corresponding to integrated beam system is tnom>t>tmm. In this way, beam structure can more evenly distribute applied loads across a larger region of housing 102 thereby minimizing the likelihood of buckling or deformation.

Unlike the assembly of conventional portable electronic devices where components are assembled in a top-down manner (i.e., the components are inserted into the housing before the bezel is snapped on), the undercut geometry of housing 102 requires that all components fit within the dimensions (L, W) of opening 104. Moreover, the assembly of portable electronic device 100 can be carried out in a bottom-up manner. In order to facilitate the bottom-up assembly of portable electronic device 100 and to minimize any offsets between the polished top glass layer and an uppermost portion of the housing (racetrack 110), various techniques, apparatus and systems can be used that minimize stack (i.e., z direction) tolerance as well as to increase component density within housing 102.

The following discussion describes specific approaches to both minimizing the Z height of the assembled components and maximizing component density within housing 102. In other words, the Z stack associated with installed internal components is such that the components can be easily accommodated by cavity 200 without the need to resort to lengthy and time consuming assembly procedures. The reduced Z stack and improved component density can be accomplished in many ways such a configuring the structure of an internal component to perform multiple functions. For example, portable computing device 100 can include a battery assembly. The battery assembly can, in turn, include battery cells that can be suspended from an upper protective layer leaving a gap (referred to as a swell gap) between a lower surface of housing 102 and a lower surface of the battery cells. In conventionally arranged battery assemblies, the battery cells would require space above the battery cells to accommodate swelling anticipated to occur during normal operation. However, by placing the swell gap below the battery cells, space between the battery cells and the housing that would otherwise be wasted can be used in a productive manner. Component density can also be increased. For example, circuits that would otherwise be considered separate can be combined to share a single connector. For example, an audio module can include both a microphone and associated circuitry that can share a flex connector with an audio circuit used to produce audio output. In this way, both the number and overall footprint of the internal components can be substantially reduced without adversely affecting overall functionality.

Moreover, efficient assembly techniques can be provided that substantially reduce the time and effort required for assembly. One such technique can include coordinating the installation of a number of internal components in such that securing one component can have the effect of securing all of the components. For example, portable computing device 100 can include a main printed circuit board (referred to as a highway board) that can extend substantially across the length of portable computing device 100. In this way, the main printed circuit board can connect internal components that are disparately located within housing 102 without the need for long connectors. Moreover, by judiciously selecting those components to attach to the main printed circuit board and in what order can greatly simplify the assembly process. For example, connector assembly 124 and a main logic board, or MLB, can be mounted but not yet secured to the main printed circuit board in such as a way that securing connector assembly 124 to the main printed circuit board has the effect of simultaneously securing the MLB. In this way, a single act of securing the connector assembly secures both the MLB and the main printed circuit board thereby eliminating a number of separate securing operations.

FIGS. 3-9 illustrate the operational components of portable computing device 100. The operational components are organized in layers. The relationship and organization of the operational components within each layer and the relationship between layers can be used to facilitate both the assembly and optimization of the Z stack of the internal components of portable computing device 100. In this way, minimizing the Z stack, portable computing device 100 can be extremely compact, sturdy, aesthetically pleasing and ergonomic at relatively low cost.

FIG. 3 presents a top level internal view 300 of portable computing device 100 showing a specific arrangement of various internal components. In one embodiment, the internal components can include at least battery assembly 302. Battery assembly 302 can include at least two battery cells 304, 306 supported by battery frame 308. In the described embodiment, first protective layer 310 can wrapped around and attached to battery frame 308. First protective layer 310 can provide protection to battery cells 304 and 306. In some cases, first protective layer 310 can be formed of resilient yet durable material such as Mylar™ having an adhesive layer. Battery cells 304 and 306 can be attached to first protective layer 310 using the adhesive. In this way, battery cells 304 and 306 can be suspended from first protective layer 310 leaving a space between a lower surface of the battery cells 304 and 306 and interior surface 218 of housing 102. This space (which can be referred to as a swell gap) can be sized to accommodate any swelling of battery cells 304 and 306 that typically occurs during battery powered operation of portable computing device 100. It should be noted that in addition to first protective layer 310, a second protective layer can be applied to the lower surface of battery cells 304 and 306 using an adhesive, for example. The second protective layer can provide protection to battery cells 304 and 306 especially in those cases where steps 216 (or at least the steps in the vicinity of the lower surface of battery cells 304 and 306) are not rounded or otherwise shaped to avoid sharp edges. In the described embodiments, the second protective layer can be formed of any number of suitable materials that can include, for example, polyetheretherketone otherwise known as PEEK. Battery frame 308 can be shaped to conform to step patterns formed in housing 102. In this way, battery frame 308 can be mounted directly to housing 102 using selected mounting steps. In this way, battery frame 308 does not require special machining or other extraneous processing to be mounted to curved interior surface 218 of housing 102.

The internal components can include main logic board 312 that can include a number of operational circuits such as a processor, graphics circuits, (optional) RF circuitry, semiconductor memory, such as FLASH, and so on. MLB 312 can receive power from battery assembly 302 by way of electrical connectors. In one embodiment, MLB 312 can be supported, in part, by battery frame 308. The internal components can also include main printed circuit board (mPCB) 314 connected to MLB 312 by way of board to board connector 316. In the described embodiment, board to board connector 316 can include a suitable number (such as 70) of pins to provide an adequate number of communication channels between MLB 312 and other circuits in portable computing device 100. In order to facilitate communication between MLB 312 and other circuits in portable computing device 100, mPCB 314 can provide appropriate interconnection resources for MLB 312. The interconnection resources provided by mPCB 314 can include a number of electrical traces formed of conductive material incorporated into a substrate of rigid material. In order to reduce the impact on the Z stack height of the internal components, mPCB 314 can be supported in part by battery frame 308 in such a way that at least some of the vertical extent of mPCB 314 is below a top surface of protective layer 310. Furthermore, in order to protect other circuits, such as a display panel that can flex (which can be as much as 0.5 mm) in response to an external applied force (such as a user's finger pressing on cover glass 106), protective layer 318 can be adhered to a top surface of mPCB 314.

The internal components can include speaker module 320 that can include audio circuits arranged to provide an audio signal to audio drivers 322 and 324. Audio drivers 322 and 324, in turn, can provide audible output to speakers 120. Wireless circuit 326 can be mounted directly to an underside of mPCB 314 thereby using space that would otherwise go unused in a more efficient manner. In this way, the overall component density can be enhanced while at the same time reducing the number of interconnects used (since wireless circuit 316 is connected directly to mPCB 314). Portable computing device 100 can also include a number of antennae used for both transmission and reception of RF energy. For example, first (logo) antenna 328 (shown in dotted line form) can be incorporated into opening 202 and, in some embodiment, be embedded in a logo, the logo being incorporated into housing 102. Second antenna 330 can be placed in a position such that a portion can be incorporated into seal 108 for better overall reception/transmission. Integrated audio module 332 can include audio circuit 334 and microphone module 336 in a compact and integrated assembly. In the described embodiment, integrated audio module 332 can provide both audio output by way of audio jack 338 and receive audio input by way of microphone 340.

In some embodiments, portable computing device 100 can support a number of different wireless standards. For example, in those cases where portable computing device 100 supports a particular wireless standard (such as the 3G standard), portable computing device 100 can include wireless circuitry appropriate for the particular wireless standard. For example, if portable computing device 100 is 3G compliant, the MLB 312 can include 3G wireless circuitry coupled to an appropriately placed and sized RF antenna (It should be noted that as discussed in co-pending U.S. Patent Application "HANDHELD COMPUTING DEVICE" by Ternus et al. a portion of housing 102 is typically replaced with a radio transparent window in co-operation with the RF antenna). Flex connector 342 can connect integrated audio module 332 to MLB 312 whereas display bus 344 can connect display driver circuitry to MLB 312 by way of display connector 346. In the described embodiment, display bus 344 can take the form of a low voltage differential signaling, or LVDS, bus. Bus 348 can include signal lines for coupling MLB 312 to power switch 114, mute button 116 and volume switch 118 and connector 350 can carry audio signals to speakers 120.

Figure 4A:
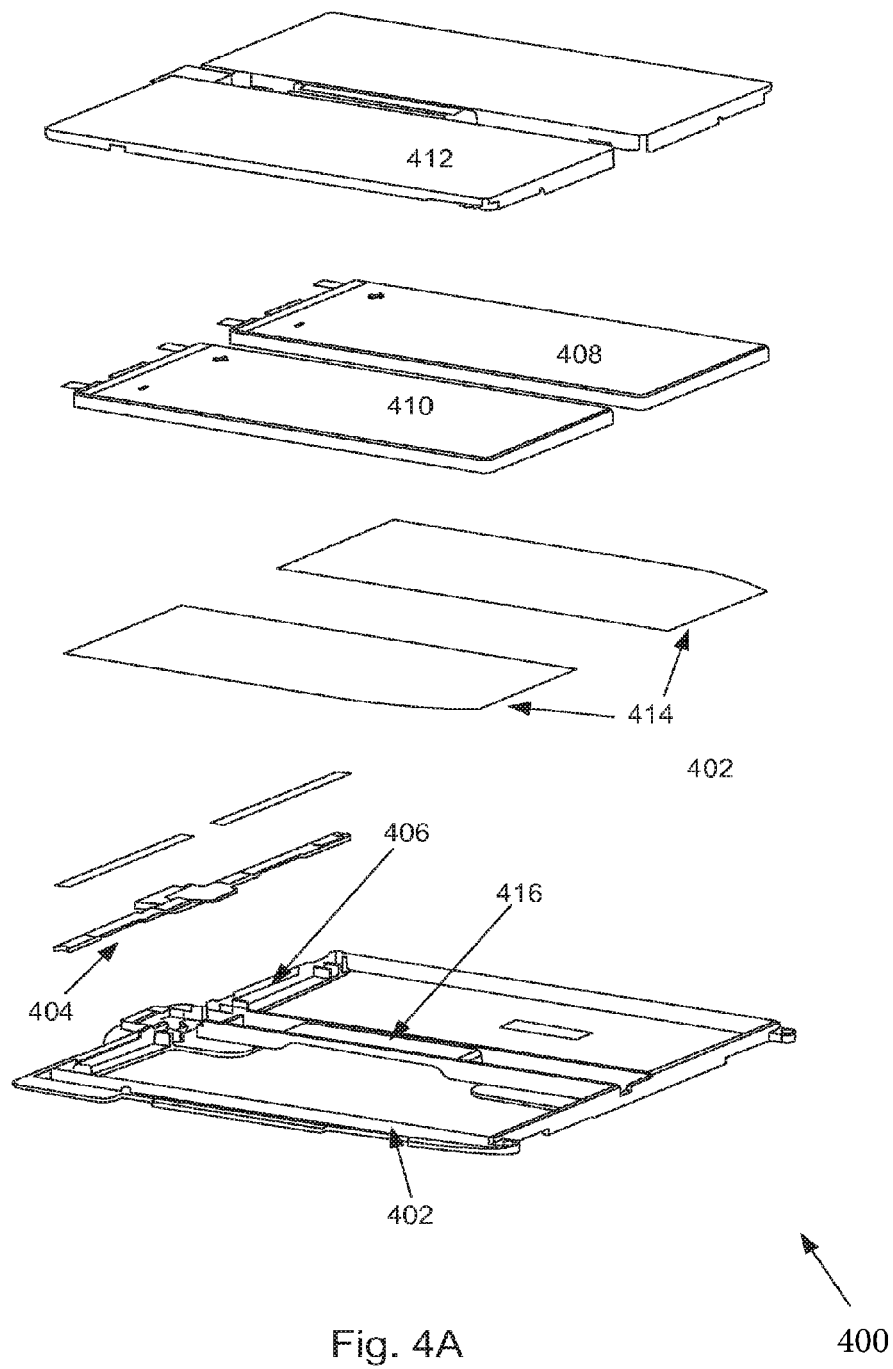
FIG. 4A shows an exploded view of battery assembly in accordance with the described embodiments.

FIG. 4A shows an exploded view of battery assembly 400 in accordance with the described embodiments. Battery assembly 400 can include battery frame 402 onto which can be mounted circuit 404. Circuit 404 can include battery regulation and safety circuits arranged to protect battery assembly 302 from any number of operating excursions that could cause damage to battery assembly 400. Circuit 404 can also include connectors used to provide power from battery assembly 302 to MLB 312. As a safety circuit, circuit 404 can provide a fuse type circuit that prevents battery assembly 302 from overheating. Circuit 404 can be placed onto battery frame 402 within cavity 406. Battery cells 408 and 410 can be surrounded by first protective layer 412 on a top portion and second protective layer 414 adhered to a bottom portion of each of battery cells 408 and 410. In the described embodiment, second protective layer can take the form of PEEK whereas first protective layer 410 can take the form of Mylar. Platform 416 can be used to support mPCB 314.

Figure 4B:
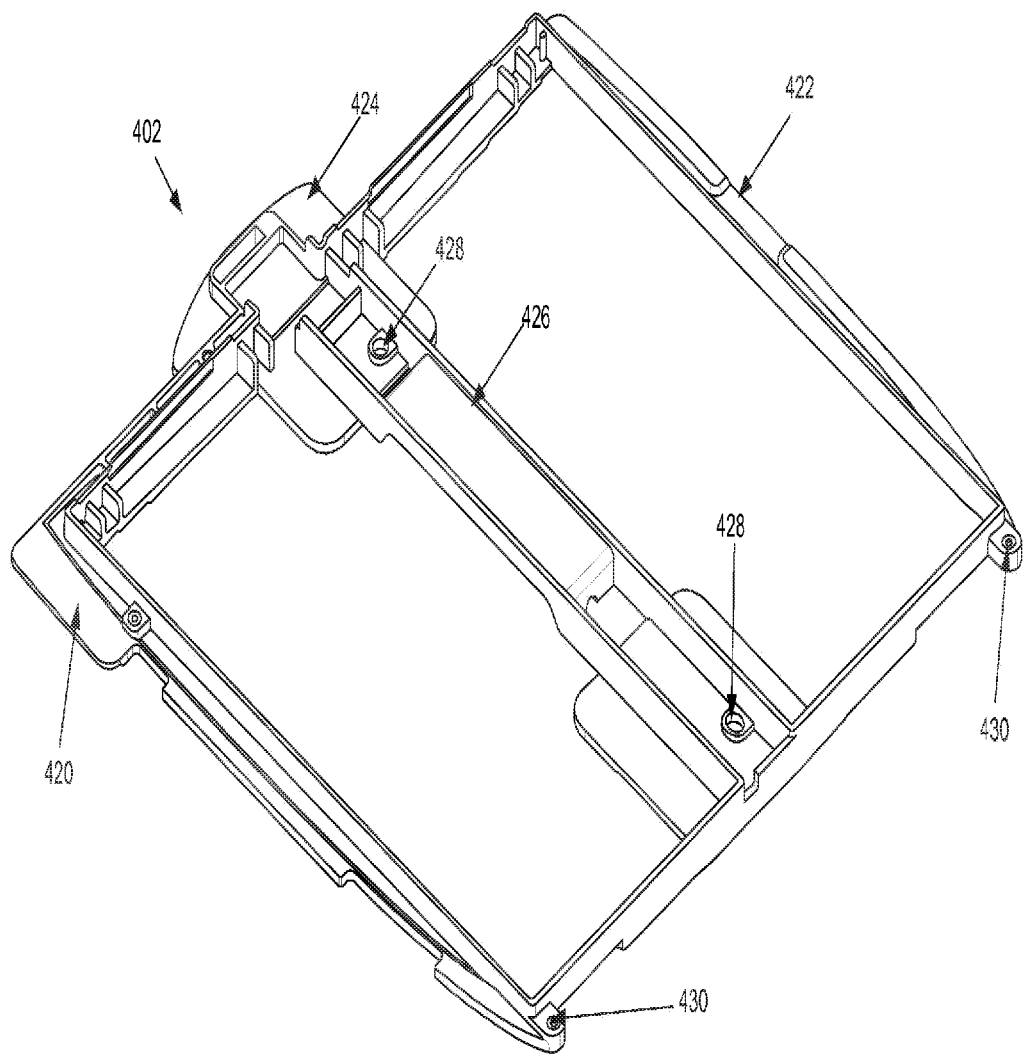
FIG. 4B shows a close up view of battery frame shown in FIG. 4A.

FIG. 4B shows a close up view of battery frame 402. Battery frame 402 can be placed directly onto housing 102 using attachment features 420 and 422 that can be shaped to conform to a nearby step pattern formed in housing 102. In this way, battery frame 402 can be attached directly to housing 102 using adhesive, such as epoxy, without requiring special machining. Once securely mounted to housing 102, battery frame 402 can be used to mount other components within portable computing device 100. For example, MLB 312 can be supported by MLB support 424 whereas mPCB 314 can be placed on platform 426 and secured using attachment features 428. Bosses 430 can be used to attach other components (such as speaker module 320) to housing 102.

FIG. 5 shows cross section 500 along line AA of FIG. 3 bisecting battery assembly 302, logo 502 and mPCB 314. In particular, cross section 500 illustrates compact nature of the assembled internal components. For example, logo 502 can encompass an RF antenna (referred to as a logo antenna) supported by antenna carrier 504. In order to avoid unnecessary interference with RF transmissions from the logo antenna, logo 502 can be formed of radio transparent material such as plastic, glass, ceramic and so on. However, in order to prevent the logo antenna from interfering with the operation of RF sensitive circuits within portable computing device 100 (and vice versa) and to therefore limit electronic noise, antenna carrier 504 can formed of a radio-opaque material (such as a grounded metal sheet) that can be placed over and completely surround the logo antenna. In so doing, a substantial portion of any RF energy that backscatters from the logo antenna can be prevented from interfering with RF sensitive circuits. Display module circuit 506 can be connected to LVDS bus 344 by way of connector 346 and be used to drive display panel 508.

Figure 6:
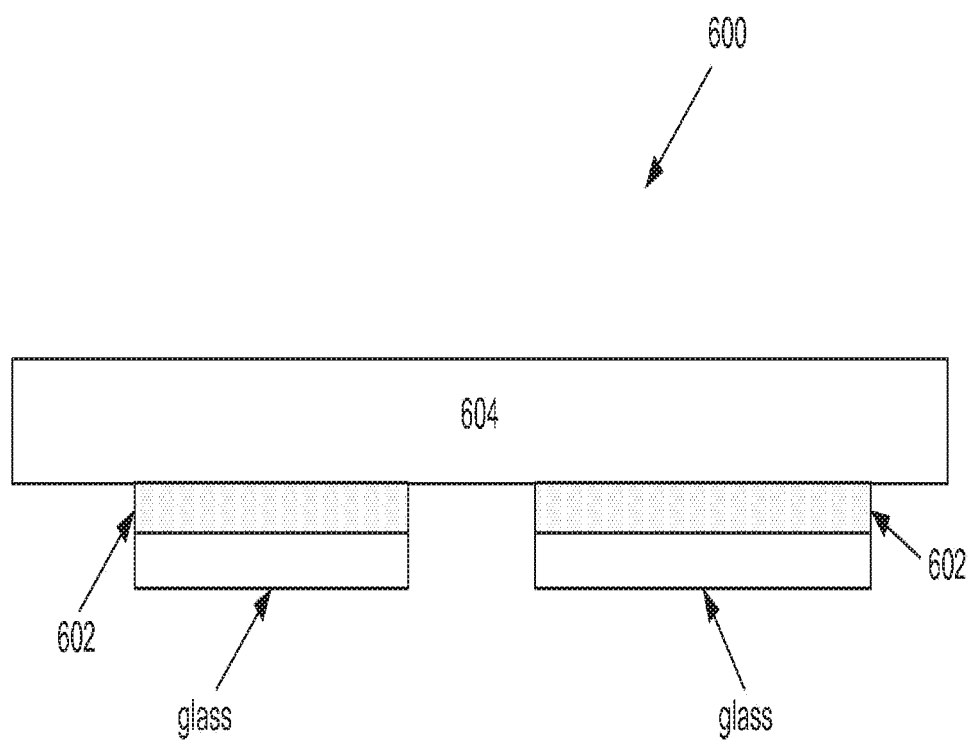
FIG. 6 shows a representative cross section of logo in accordance with the described embodiments.

FIG. 6 shows a representative cross section of logo 600 in accordance with the described embodiments. As shown, logo 600 can be formed of glass, or similar material, mounted by way of adhesive 602 (such as PSA) to substrate 604. In this way, the esthetic look of logo 600 can be enhanced due to transparent or near transparent nature of the glass used to fabricate logo 600. In some cases, the glass can facilitate the transmission of light emanating from portable computing device 100. It should also be noted, that due at least to the presence of adhesive 602, any impact to logo 600 will likely only result in the cracking of glass of logo 600 with little or no shattering.

Figure 7:
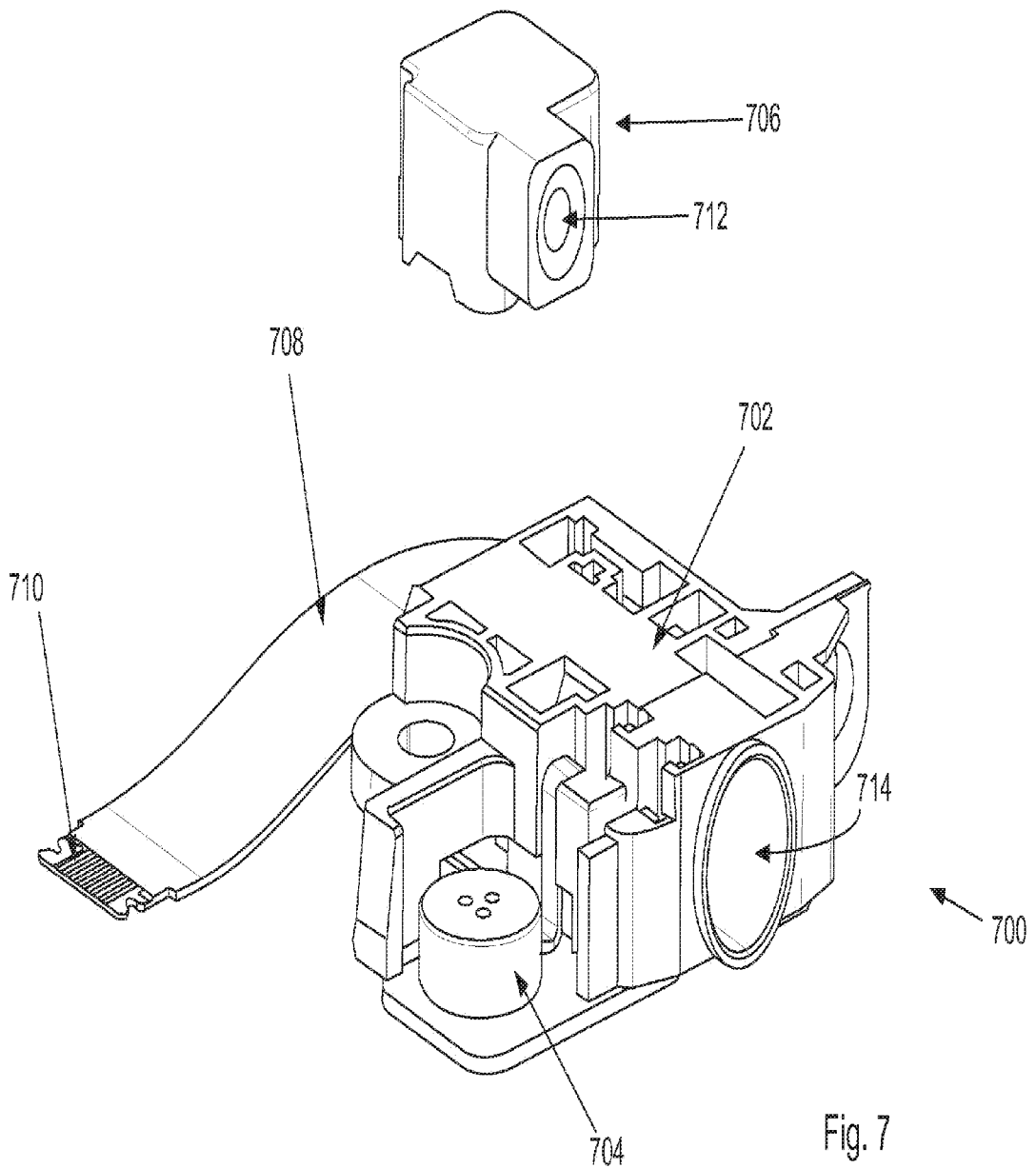
FIG. 7 shows exploded view of integrated audio module 700 in accordance with the described embodiments.

FIG. 7 shows exploded view of integrated audio module 700 in accordance with the described embodiments. Integrated audio module 700 includes audio circuit 702 and microphone module 704 enclosed within sealing boot 706. Both audio circuit 702 and microphone module 704/sealing boot 706 are incorporated onto audio module flex 708 connected to MLB 312 by way of board to board connector 710. By incorporating audio circuit 702 and microphone module 704 onto audio module flex 708, microphone port 712 (part of sealing boot 706) and audio jack 714 can be placed in close proximity to one another in housing 102. In the described embodiment, microphone port 712 can be approximately 1 mm in diameter.

The portable computing device 100 can include one or more button assemblies by which the user of the portable computing device 100 can activate various functions. Button assemblies can be mounted through the surface of the cover glass 106 of the display in the portable computing device 100 or through a front, side or back portion of the single piece housing 102 of the portable computing device 100. The button assemblies can be designed to provide a desired tactile feedback to the user when activating the button assembly's function. In addition, the button assemblies can be designed, in conjunction with designs of both outer surfaces of and inner connection points within the portable computing device 100, to be positioned approximately flush with the outer surfaces in neutral, "non-depressed" state, even with internal circuit boards located at a distance from a top portion of the button assembly.

Figure 8A:
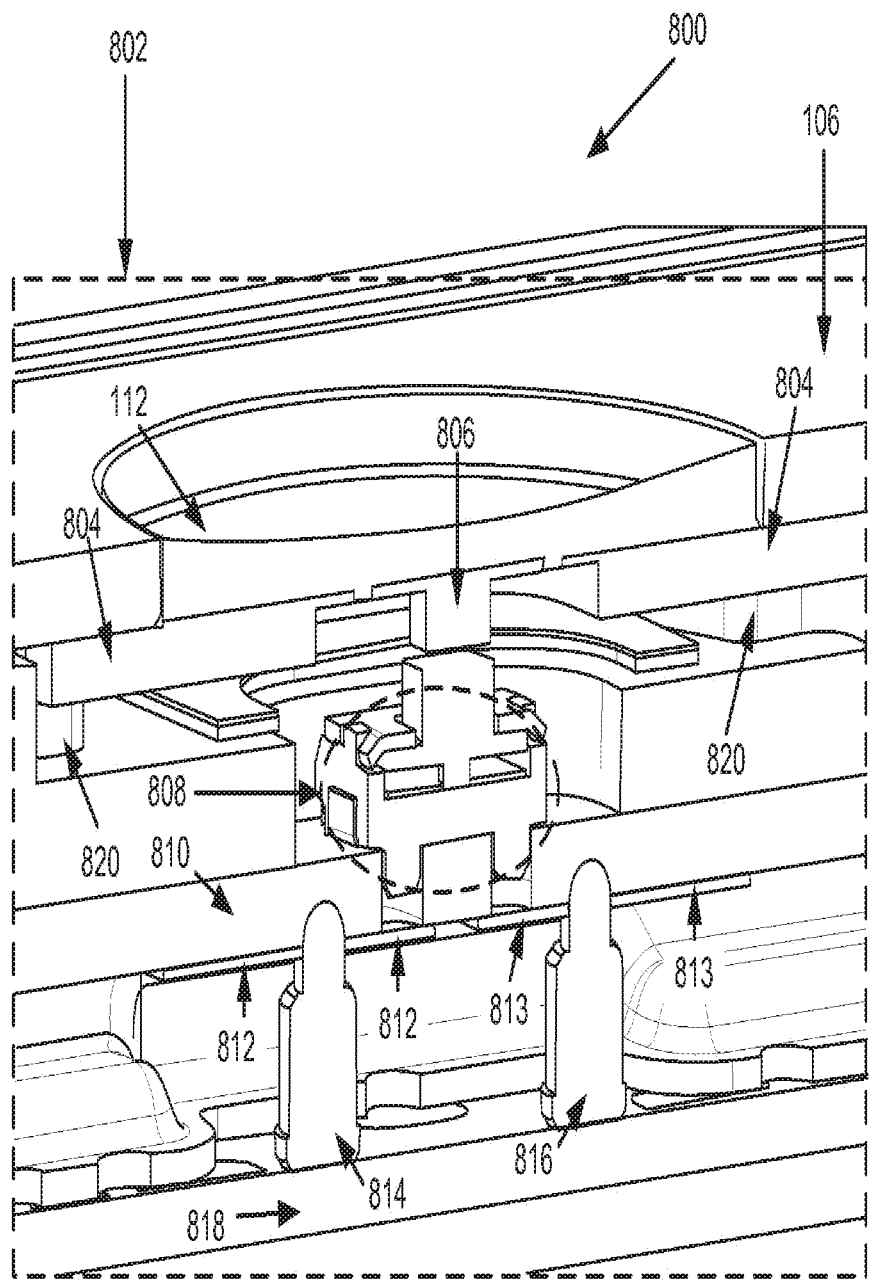
FIG. 8A illustrates a cross-sectional perspective view of a button assembly mounted through a cover glass of a portable computing device in accordance with the described embodiments.
Figure 8B:
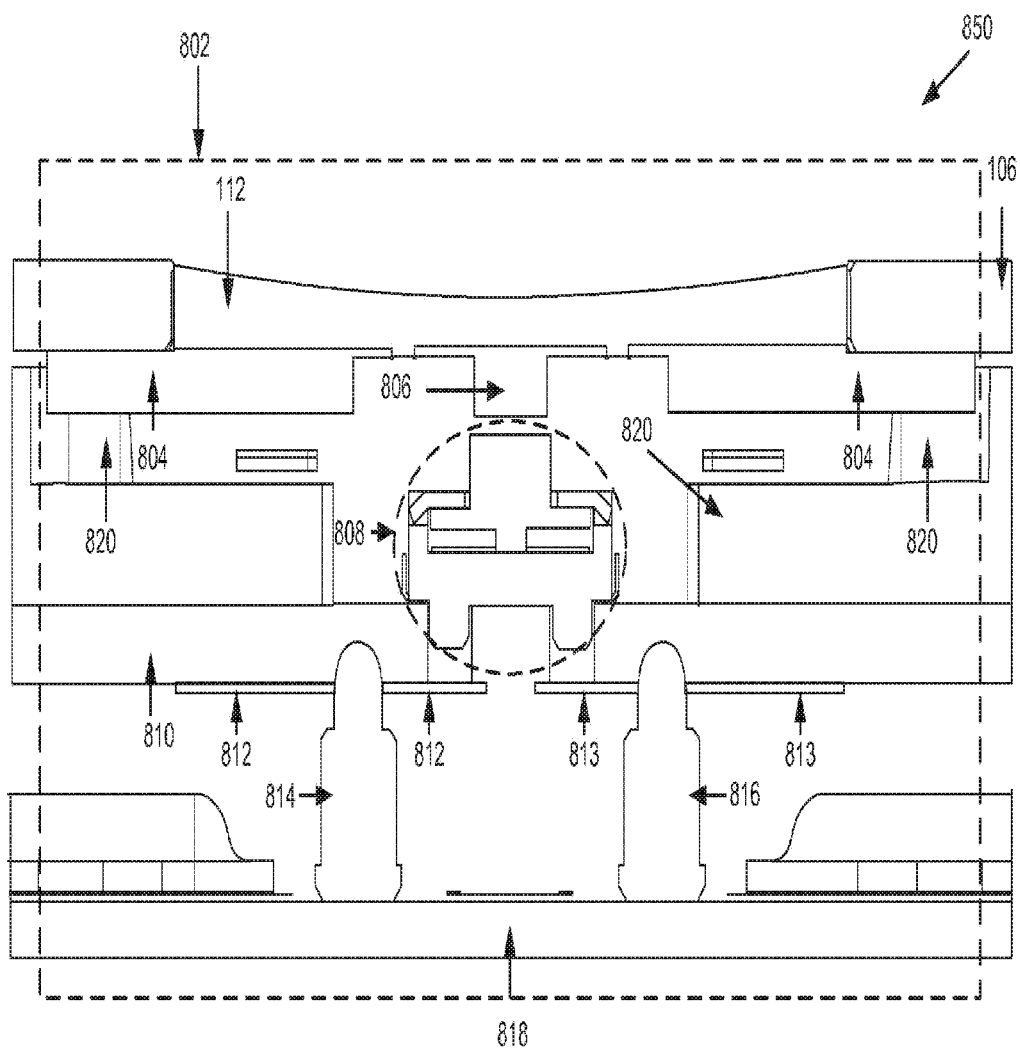
FIG. 8B illustrates a second cross-sectional view of the button assembly mounted in the portable computing device shown in FIG. 8A.

FIG. 8A illustrates a first cross-sectional perspective view 800 and FIG. 8B a second cross-sectional view 850 of a home button assembly 802 mounted through cover glass 106 of a portable computing device 100 in accordance with the described embodiments. The home button assembly 802 can include an external flat or curved button body 112 that rests approximately flush with an exterior surface of cover glass 106. Side flanges 804 can be mounted on the underside of (or integrally formed with) the external button 112 and extend beneath the underside of cover glass 106. A central post 806 can also be mounted to the underside of (or be integrally formed with) the external button body 112 positioned above a tactile switch unit 808. In a neutral, "non-depressed" state the central post 806 can be at a distance from the tactile switch unit 808. Upon depressing the external button body 112, the central post 806 can contact the tactile switch unit 808 in a manner that results in closing a contact circuit within the tactile switch unit 808. The use of the tactile switch unit 808 can allow a user of the portable computing device 100 to experience a different "feel" when pressing at different locations on the surface of the external button body 112, as the external button body 112 can pivot about the top of the tactile switch unit 808.

The internal components of the portable computing device 100 can include a printed circuit board 818 through which signals can be conducted as a result of depressing the external button 802. As illustrated in FIG. 8A, the printed circuit board 818 can be located at a distance from contact points of the tactile switch unit 808. The distance can be such that the tactile switch unit 808 cannot be mounted directly on the printed circuit board 818, as the travel distance of the center post 806 of the external button body 112 can be too short to reach the tactile switch unit 808 when depressed to activate a function. The printed circuit board 818 can also include components in a region directly beneath the external button body 112 that preclude mounting the tactile switch unit 808 directly to the printed circuit board 818. Instead a connection can be made between the printed circuit board 818 and the tactile switch unit 808.

As shown in FIGS. 8A-B, the tactile switch unit 808 can be mounted to an intermediate printed circuit board 810. In some implementations, the intermediate printed circuit board 810 can be connected to the printed circuit board 818 through a flexible cable; however, such a connection can complicate the assembly process. In some embodiments, the flexible cable connection can preclude a simple machine automated assembly and require manual assembly by a technician. The representative embodiment shown in FIGS. 8A-B avoids manual assembly by enabling a connection from the intermediate printed circuit board 810 to the printed circuit board 818 through a pair of conductive posts 814/816 and a pair of conductive pads 812/813. A first conductive post 814, for example, can be connected to a DC power level supplied through the printed circuit board 818, while the second conductive post 816 can be connected to a GND level in the printed circuit board 818. Conductive posts 814 and 816 can be connected to separate conductive pads 812 and 813 respectively mounted on the underside of the intermediate printed circuit board 810. Depressing the external button body 112 can close a circuit within the tactile switch unit 808 connecting the first conductive post 814 to the second conductive post 816 and thereby permitting current to flow, which can activate directly or indirectly a function of the portable computing device 100. In addition to providing a conductive path, the conductive posts 814/816 can be sized and positioned between the intermediate printed circuit board 810 and the printed circuit board 818 to "tune" the tactile feel of the button assembly 802 for the user of the portable computing device 100. For example, the conductive posts 814/816 can be positioned closer together or further apart, and the thickness of the intermediate printed circuit board 810 can be varied to increase or decrease flexing that can occur when depressing the external button 802 to contact the tactile switch unit 808.

As shown in FIGS. 8A-B the intermediate circuit board 810 to which the tactile switch unit 808 mounts can be covered in certain regions by a stiffener section 820. The stiffener section 820 can be shaped to include vertical walls that prevent the flanges 804 underneath the external button body 112 from moving laterally in one or more directions and also from rotating clockwise or counterclockwise, thereby stabilizing the external button body 112 when pressed by the user. FIG. 8C illustrates a simplified top view of the home button assembly with the flanges 804 extending from underneath the external button body 112. The top of the external button body 112 can include directional markers 822 that can assist a user in locating the external button body 112 as well as guide the user into applying pressure at appropriate locations on the external button body. The directional markers 822 can take different forms including tactile raised dots and compass point (for example north (N) and south (S)) markers. During operation of the portable computing device 100, the user can apply pressure off center on the surface of the home button body 112. In some embodiments, the home button body 112 can incur an unacceptably high probability of "sticking" when a top portion of button body 112 or flanges 804 can "dive under" a portion of a stiffener section 826. For example, by pressing at the "S" end of the external button body, an edge of the anti-rotation ring 824 can catch beneath an adjacent stiffener section. To prevent such "diving", a flexure 824 can be attached (such as by a pressure sensitive adhesive) at a first end 828 to the bottom surface of the button body 112 or flanges 804 and at a second end 830 to a surface of a nearby portion of the stiffener section 820. The flexure can allow vertical movement of the external home button 112 but resist lateral horizontal movement of the external button body 112 and also prevent rotation along any axis, thereby preventing the external button body 112 from diving under the adjacent portion of stiffener section 826 and moving essentially in a z-direction perpendicular to the surface of the portable media device 100.

Button assemblies can also be mounted through a portion of the single piece housing 102 that encloses the portable computing device 100. As the single piece housing 102 can be relatively thin to reduce weight of the portable computing device 100, openings in the housing 102 can impact the structural integrity of portions of the housing 102 near the opening. For relatively large openings, a structural support section can be included inside the housing 102 to improve rigidity; however, a button assembly can still require access through the structural support section. It can be desirable to minimize the size of openings through the structural support section, thereby retaining a desired strength of structural support, when using a relatively larger exterior button that can use a relatively larger opening in the housing 102.

Figure 9D:
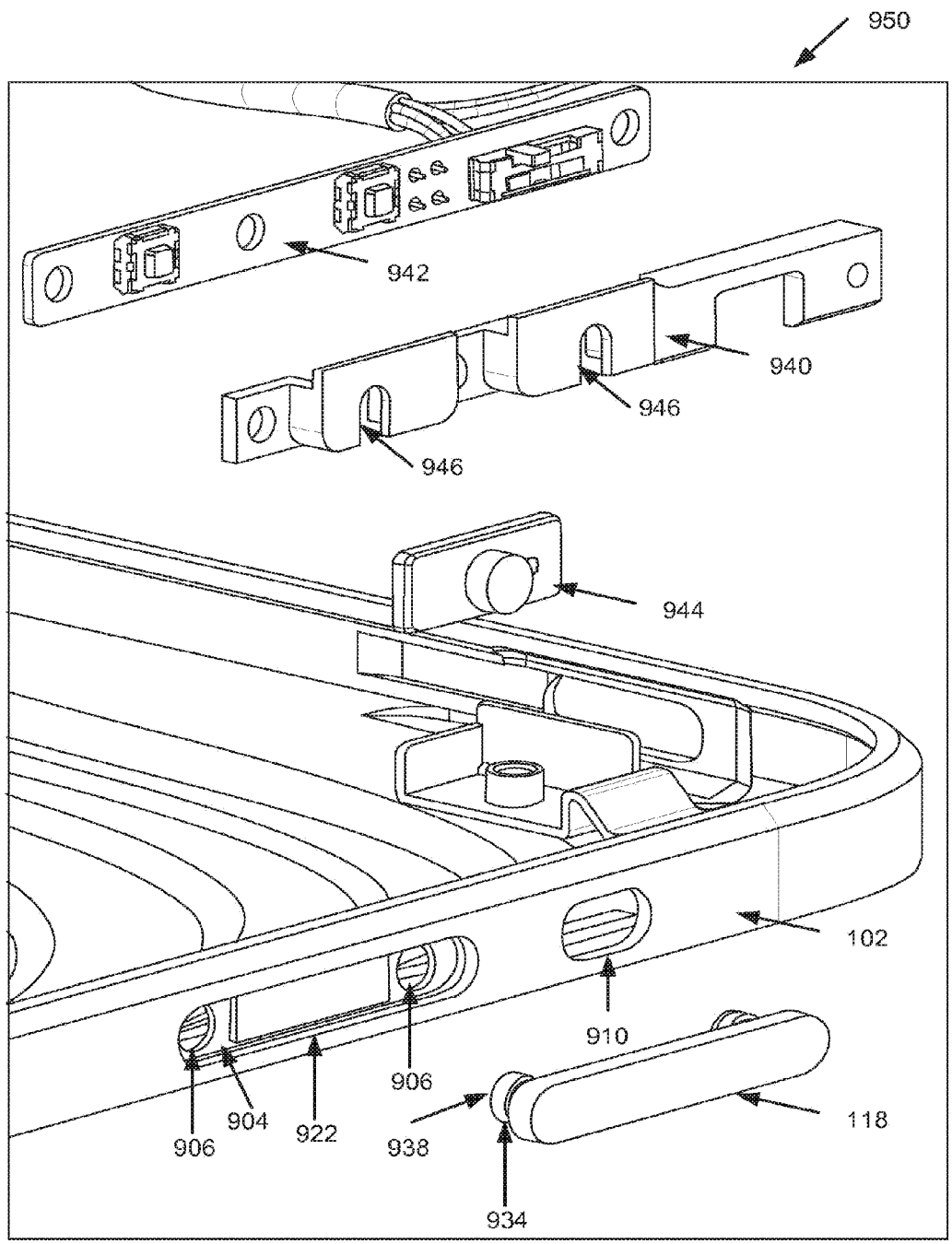
FIG. 9D illustrates an exploded perspective external view of the button assembly illustrated in FIGS. 9A-C.

FIG. 9A illustrates an interior perspective view 900 of a housing 102 of a portable computing device 100 that includes openings for button assemblies and a structural support section 904. As shown in FIG. 9B a relatively large external opening 922 through the housing 102 can be substantially larger than the openings 906 through the structural support section 904. Some openings through the housing 102, such as opening 910, can be sized sufficiently small that a structural support section is not required, while larger openings such as opening 922 can require additional structural support. The structural support section 904 can include mounting holes 908 to which a retention bracket can be secured and retain an external button mounted through the housing 102 and structural support section 904. The structural support section 904 can be attached to housing 102 using an epoxy adhesive or by welding or by other appropriate means. FIGS. 9C and 9D illustrate exploded internal and external views respectively of a button assembly with the relatively large opening 922 in the housing 102 augmented by the structural support section 904. An external volume button 118 can include two posts 934, each post 934 having a stem portion 936 connected to the back side of the external volume button 118 and a capture portion 938, wider than the stem portion 936, which can contact a tactile switch mounted inside the housing 102. In a representative embodiment, the external button 932 can be a "volume" button that can be depressed in two directions to activate two different functions such as "louder" and "softer" by contacting two separate tactile switches.

As shown in FIG. 9C, a smaller button, for example the mute button 116, can be mounted from the inside of the housing 102 as the opening 910 through which the mute button 116 extends is sufficiently large to accommodate the external sections of the mute button 116 while not affecting the structural integrity of the housing 102. The volume button 118, however, cannot be mounted from the inside of the housing 102, as the structural support section 904 partially blocks the opening 922 for the external section of the volume button 118. Instead volume button 118 can be mounted from outside of the housing 102. Two openings 906 in the structural support section 904 can be sized appropriately to pass the capture portion 938 of the posts 934 on the button 932 through. After inserting volume button 118 through the housing 102, a retention bracket 940, which includes relatively narrow slots 946 sized according to the diameter of the stem portion 936 of the posts 934, can be inserted to capture and retain volume button 118 securely in the housing 102. The capture portion 938 of the posts 934 on volume button 118 can contact tactile switches mounted on a printed circuit board 942 placed behind the retention bracket. The printed circuit board 942 and the retention bracket 940 can include mounting holes through which they can be secured by fasteners to holes 908 in the structural support section 904.

Figure 9E:
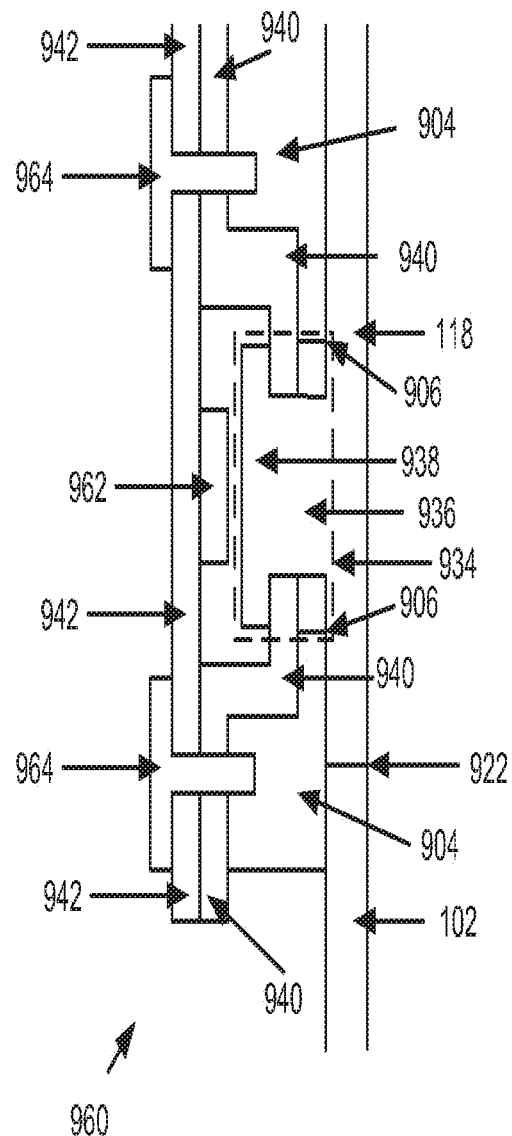
FIG. 9E shows a simplified horizontal cross-sectional view of a portion of the button assembly illustrated in FIGS. 9A-D.

The button assembly shown in FIGS. 9A-D enables the relatively large volume button 118 to be mounted securely through relatively large hole 922 in housing 102 and to contact a pair of tactile switches mounted inside, while also including structural support of the housing 102 around the opening 922. Structural support integrity of the combination of the housing 102 and the structural support section 904 can be retained by using this "outside to inside" button assembly. FIG. 9E illustrates a simplified horizontal cross-sectional view of a portion of the button assembly of FIGS. 9A-D when assembled together. A post 934 of the volume button 118 extends through opening 922 in housing 102 and also through the narrowing opening 906 in structural support section 904, sized to allow passage of the capture portion 938 of the post 934. The retention bracket 940 surrounds the stem portion 936 of the post 934 and holding the post 934 of the volume button within the button assembly as the opening in the retention bracket 940 can be narrower than the diameter of the capture portion 938. The capture portion 938 of the post 934 can contact a tactile switch 962 mounted on printed circuit board 942 when the user presses on the exterior of volume button 118. Printed circuit board 942 and retention bracket 940 can be secured to structural support section 904 by fasteners 964 through holes (as shown in FIGS. 9C-D) therein.

Figure 10:
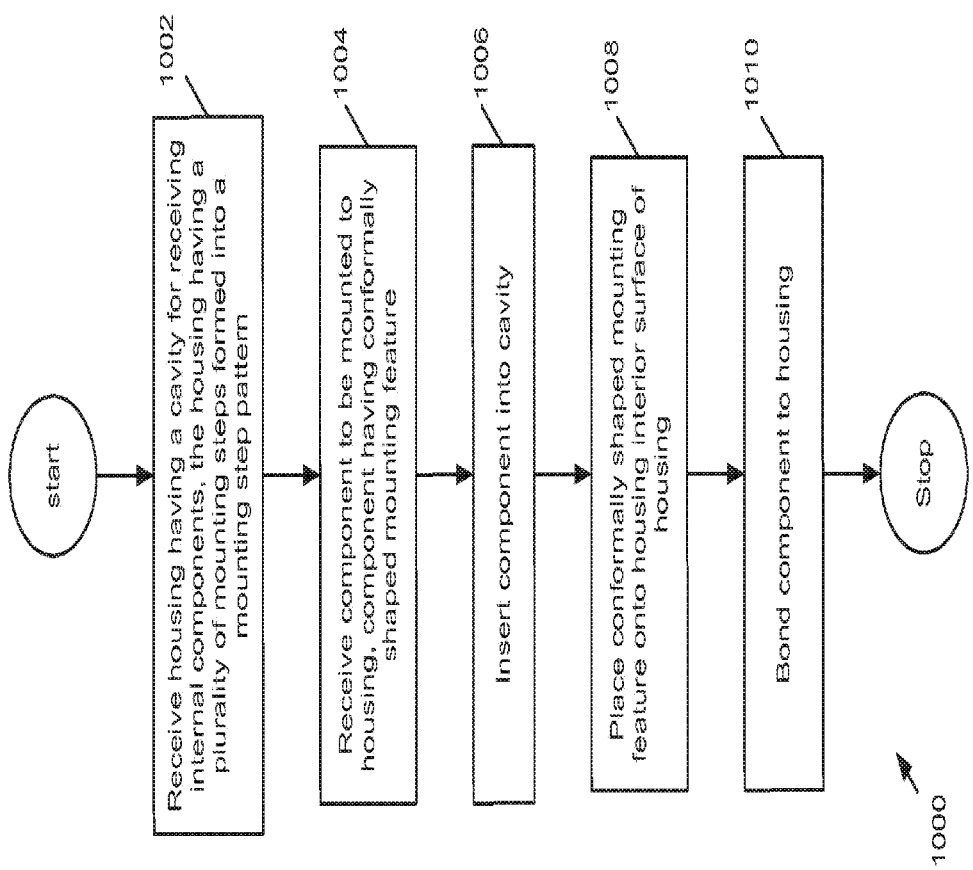
FIG. 10 shows a flowchart detailing a process in accordance with the described embodiments.

FIG. 10 illustrates a flow diagram describing process 1000 for assembling internal components for a portable computing device in accordance with the described embodiments. Process 1000 begins at 1002 by receiving housing suitable for enclosing and supporting internal components of the portable computing device. The components can include, for example, a battery assembly, a main printed circuit board, a main logic board, and so on. In the described embodiment, the housing includes a plurality of mounting steps formed on interior bottom surface of the housing. The mounting steps can be formed in the housing using any well known machining operation. The steps can have a step height suitable for providing a good mounting surface for the internal components. In addition to providing a good mounting surface, the housing material removed to form the plurality of steps substantially reduces the weight of the housing with adversely affecting the structural integrity of the housing. Once the housing has been received at 1004, the component can be inserted into the cavity at 1006 and placed in direct contact with the interior surface of the housing at 1008 using the mounting steps. In this way, the mounting feature can be mounted directly to the interior surface of the housing. Once placed directly onto the interior surface of the housing, the component can be attached to the housing at 1010 using any well known attaching process such as epoxy, welding, and so on.

Figure 11:
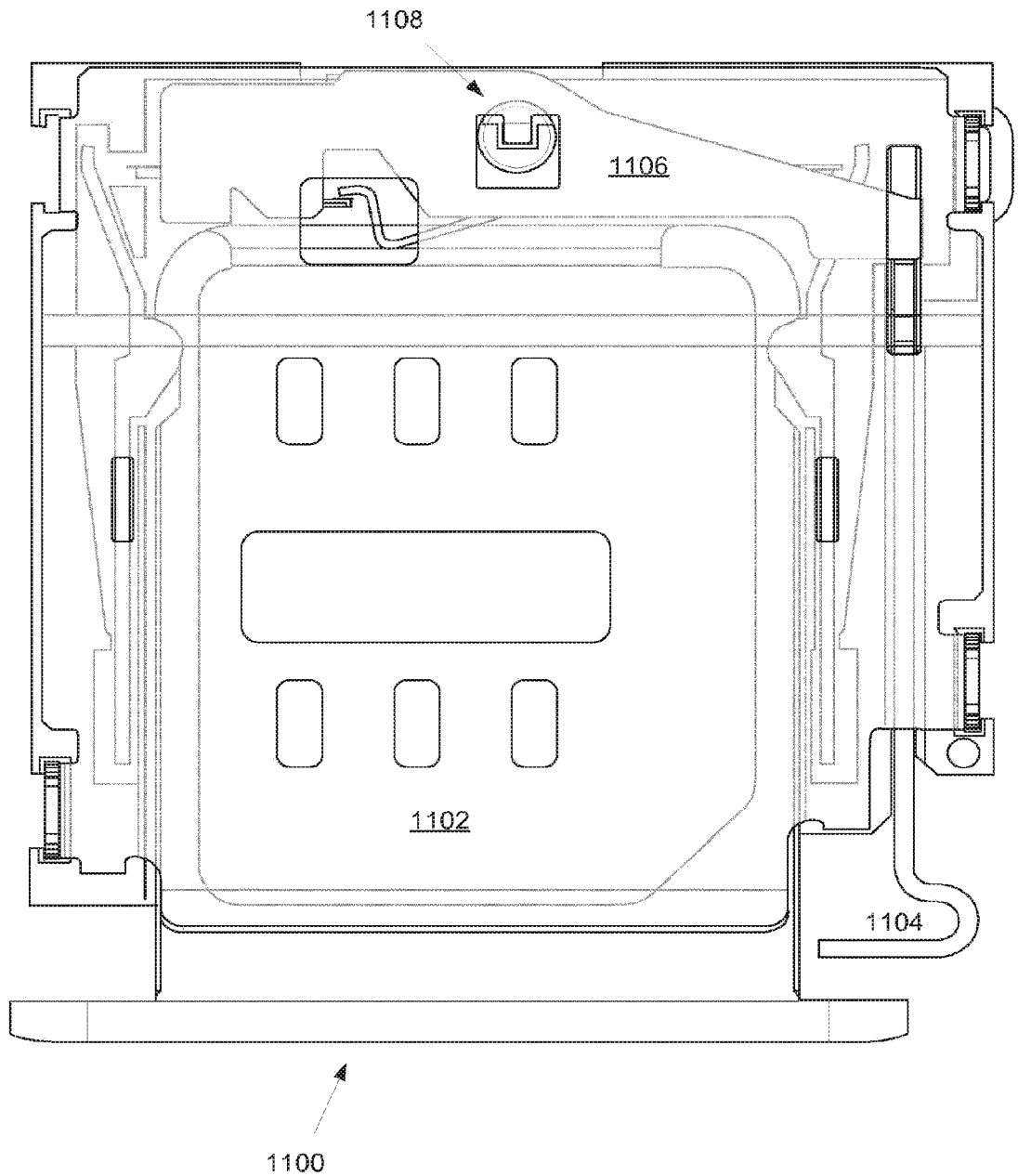
FIG. 11 shows SIM card in accordance with the described embodiments.
Figure 12:
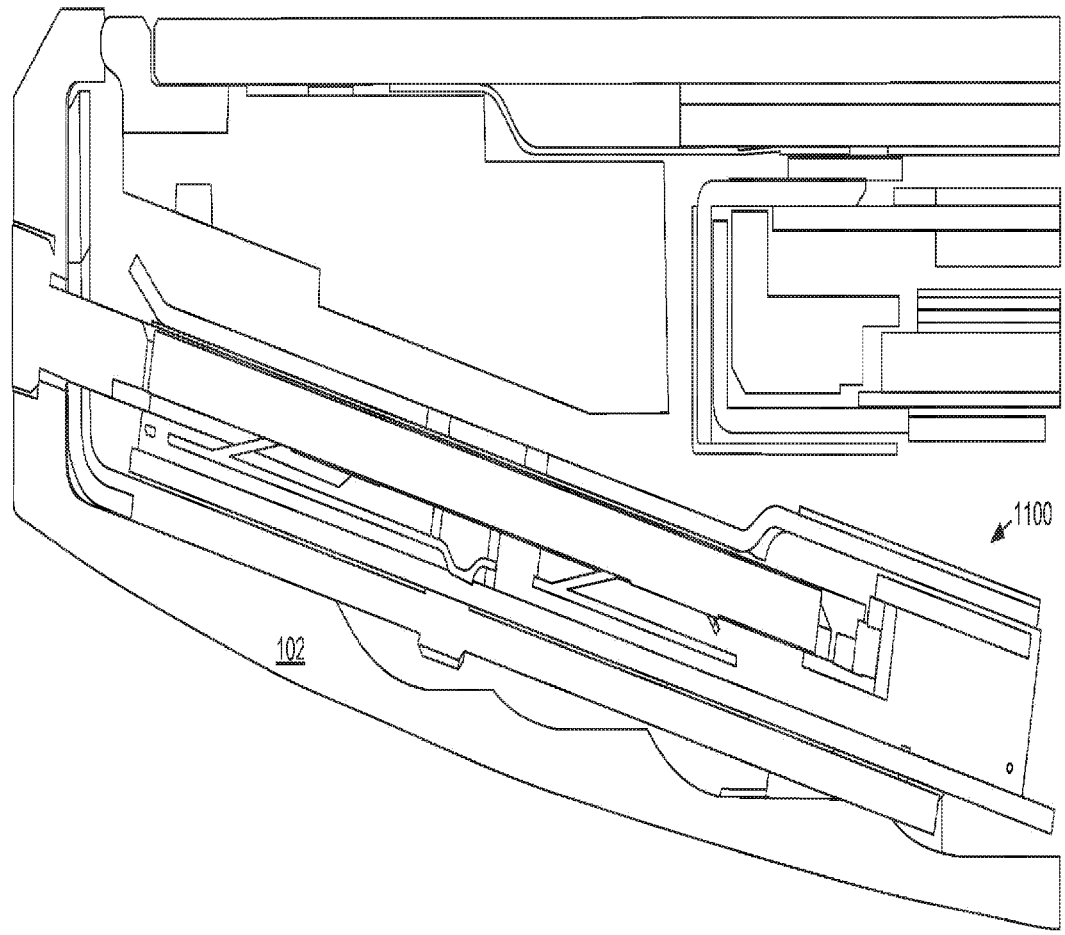
FIG. 12 shows SIM card of FIG. 11 incorporated into portable computing device.

FIG. 11 shows an embodiment of SIM card release mechanism 1100 in accordance with the described embodiments. SIM card release mechanism 1100 can include tray 1102 suitable for securing a SIM card when placed thereon. Push rod 1104 can be connected to ejection mechanism 1106 connected to a back portion of tray 1102. In order to eject a SIM card (or to make tray 1102 available for placing of a SIM card) a user can apply a force to push rod 1104. The applied force can be transferred by push rod 1104 to ejection mechanism 1106 that can pivot about pivot point 1108. By pivoting about pivot point 1108, ejection mechanism 1106 causes tray 1102 to move in a direction that exposes 1102 making it suitable for the user to either remove/replace or add a SIM card to tray 1102. FIG. 12 shows SIM card release mechanism 1100 included in portable computing device 100 in a particular embodiment.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. For example, although an extrusion process is preferred method of manufacturing the integral tube, it should be noted that this is not a limitation and that other manufacturing methods can be used (e.g., injection molding). It is therefore intended that the following appended claims be interpreted as including all such alterations, permutations, and equivalents as fall within the true spirit and scope of the described embodiments.

What is claimed is:

1. A portable computing device, comprising:
   a housing including a bottom wall and side walls that cooperate to, in part, define a cavity, the side walls having edges the define an opening that is opposite the bottom wall, wherein an interior surface of the bottom wall includes steps suitable for mounting an internal component thereon, wherein the steps form a terrace of steps with varying patterns; and
   a component mounted on at least one of the steps.

2. The portable computing device as recited in claim 1, wherein the component includes a mounting feature that has a shape that conforms to at least a portion of the steps such that the mounting feature is directly mounted to the bottom wall.

3. The portable computing device as recited in claim 1, wherein the component comprises a battery.

4. The portable computing device as recited in claim 1, wherein the housing is metal.

5. The portable computing device as recited in claim 4, further comprising a display.

6. The portable computing device as recited in claim 4, wherein an exterior surface of the bottom wall has a spline shape.

7. The portable computing device as recited in claim 1, wherein the steps are curved.

8. A method for installing internal components into a housing of a portable computing device, the housing having side walls and a bottom wall that cooperate to define a cavity, the sidewalls having edges that, in part, define an opening arranged opposite the bottom wall, the housing having mounting steps formed on an interior surface of the bottom wall forming a terrace of steps with varying patterns, the method comprising:
   aligning an internal component with a portion of the terrace steps, the internal component having a mounting feature that is conformally shaped to the portion of the terrace of steps; and bonding the mounting feature to at least one of the mounting steps.

9. The method as recited in claim 8, further comprising arranging a cover in the front opening.

10. The method as recited in claim 8, wherein the housing is metal.

11. The method as recited in claim 10, wherein the mounting steps are machined into the housing.

12. The method of claim 8, wherein the bottom wall comprises a spline shaped exterior surface.

13. A housing for a portable electronic device comprising:
   a bottom wall characterized as having a spline shaped exterior surface, the bottom wall cooperating with side walls to at least partially define an internal cavity of the housing, the side walls having edges that in part define an opening arranged opposite the bottom wall; and
   steps formed on an internal surface of the bottom wall for supporting and mounting an internal component, the steps having varying patterns to provide a terrace shaped internal cavity.

14. The housing of claim 13, wherein the steps are configured to support and mount multiple internal components.

15. The housing of claim 13, wherein the housing is made of aluminum and the steps are formed by machining the aluminum to provide the terraced shaped internal cavity.

16. The housing of claim 15, further comprising an integrated beam system that provides an even distribution of loads applied to the housing.

17. The housing of claim 13, wherein the steps have rounded edges.

18. The housing of claim 13, further comprising a mounting feature for coupling the internal component to at least one of the steps.

19. The housing of claim 13, wherein the housing is formed out of metal and the steps are machined to be curved.

20. The housing of claim 13, wherein the internal component is a battery.

* * * * *